United States Patent
Park et al.

(10) Patent No.: US 10,163,513 B2
(45) Date of Patent: Dec. 25, 2018

(54) PROGRAM METHOD OF MEMORY DEVICE AND MEMORY SYSTEM USING THE SAME

(71) Applicant: Samsung Electronics Co., Ltd., Suwon-si, Gyeonggi-do (KR)

(72) Inventors: Il-han Park, Suwon-si (KR); Seung-jae Lee, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/425,315

(22) Filed: Feb. 6, 2017

(65) Prior Publication Data

US 2017/0249995 A1 Aug. 31, 2017

(30) Foreign Application Priority Data

Feb. 26, 2016 (KR) .......................... 10-2016-0023629

(51) Int. Cl.
| | |
|---|---|
| G11C 16/08 | (2006.01) |
| G11C 16/10 | (2006.01) |
| G11C 16/04 | (2006.01) |
| G11C 16/34 | (2006.01) |

(52) U.S. Cl.
CPC .......... *G11C 16/10* (2013.01); *G11C 16/0483* (2013.01); *G11C 16/3427* (2013.01); *G11C 16/3459* (2013.01)

(58) Field of Classification Search
CPC ............ G11C 16/0483; G11C 16/3427; G11C 16/3459; G11C 16/10; G11C 16/04; G11C 16/34
See application file for complete search history.

(56) References Cited

U.S. PATENT DOCUMENTS

| | | | |
|---|---|---|---|
| 7,301,815 B2 | 11/2007 | Kurata et al. | |
| 7,561,469 B2* | 7/2009 | Aritome | G11C 11/5628 365/185.02 |
| 7,679,133 B2 | 3/2010 | Son et al. | |
| 7,768,844 B2* | 8/2010 | Takase | G11C 8/12 365/189.14 |
| 7,778,085 B2 | 8/2010 | Kim et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |

(Continued)

FOREIGN PATENT DOCUMENTS

| | | |
|---|---|---|
| JP | 2005-276345 A | 10/2005 |
| JP | 2006-059481 A | 3/2006 |

(Continued)

*Primary Examiner* — Hien Nguyen
(74) *Attorney, Agent, or Firm* — Harness, Dickey & Pierce, P.L.C.

(57) ABSTRACT

A program method of a memory device include determining whether valid data is stored in memory cells of a word line adjacent to a selection word line upon which a program operation is to be performed; when the valid data is not stored in the memory cells of the word line adjacent to the selection word line, performing, based on data to be written to the selection word line, a pre-program operation on the word line adjacent to the selection word line; and after the performing of the pre-program operation, performing, based on a program command, the program operation on the selection word line.

20 Claims, 19 Drawing Sheets

(56) References Cited

U.S. PATENT DOCUMENTS

| | | |
|---|---|---|
| 9,147,440 B2 | 9/2015 | Kim et al. |
| 9,159,441 B2 | 10/2015 | Kim et al. |
| 2005/0213363 A1 | 9/2005 | Oga |
| 2007/0280000 A1* | 12/2007 | Fujiu .................. G11C 11/5628 365/185.24 |
| 2008/0205147 A1* | 8/2008 | Santin ................ G11C 16/3418 365/185.17 |
| 2011/0233648 A1 | 9/2011 | Seol et al. |
| 2012/0307561 A1 | 12/2012 | Joo et al. |

FOREIGN PATENT DOCUMENTS

| | | |
|---|---|---|
| KR | 2002-0048259 A | 6/2002 |
| KR | 2004-0095926 A | 11/2004 |
| KR | 2009-0100677 A | 9/2009 |
| KR | 2011-0001102 A | 1/2011 |
| KR | 2012-0133232 A | 12/2012 |
| KR | 2012-0134941 A | 12/2012 |
| KR | 2014-0012832 A | 2/2014 |
| KR | 2015-0042652 A | 4/2015 |

* cited by examiner

PROGRAM METHOD OF MEMORY DEVICE AND MEMORY SYSTEM USING THE SAME

CROSS-REFERENCE TO RELATED APPLICATION

This application claims the benefit of Korean Patent Application No. 10-2016-0023629, filed on Feb. 26, 2016, in the Korean intellectual Property Office, the disclosure of which is incorporated herein in its entirety by reference.

BACKGROUND

At least one example embodiment of the inventive concepts relates to a memory device and a method of controlling the memory device, and more particularly, to a program method of a memory device and a memory system using the same.

Memory devices are used to store data and categorized into volatile memory devices and nonvolatile memory devices. In volatile memory devices, stored data is erased when power is cut off. However, nonvolatile memory devices maintain stored data even when power is cut off. As an example of nonvolatile memory devices, flash memory devices may be applied to portable phones, digital cameras, personal digital assistants (PDAs), computing devices, etc. A certain level of reliability or greater is required for the nonvolatile memory devices regardless of locations where data is stored.

SUMMARY

At least one example embodiment of the inventive concepts provides a program method of a memory device, the method increasing the reliability of an edge word line in the memory device.

At least one example embodiment of the inventive concepts also provides a memory system for increasing the reliability of an edge word line in a memory device.

According to at least some example embodiments of the inventive concepts, a program method of a memory device includes determining whether valid data is stored in memory cells of a word line adjacent to a selection word line upon which a program operation is to be performed; when the valid data is not stored in the memory cells of the word line adjacent to the selection word line, performing, based on data to be written to the selection word line, a pre-program operation on the word line adjacent to the selection word line; and after the performing of the pre-program operation, performing, based on a program command, the program operation on the selection word line.

According to at least some example embodiments of the inventive concepts, a memory system includes a non-volatile memory device comprising a memory cell array which is connected to a plurality of word lines and a plurality of bit lines; and a memory controller configured to control, based on a program command which is received from a host, an operation of the non-volatile memory device, the non-volatile device and the memory controller being configured such that, when valid data is not stored in memory cells of a word line which is adjacent to a selection word line of the non-volatile memory device upon which a program operation is to be performed, at least one of the non-volatile device and the memory controller, performs a pre-program operation, based on data to be written to the selection word line, on the word line adjacent to the selection word line, and then, performs the program operation according to the program command.

According to at least some example embodiments of the inventive concepts, a method includes performing a programming operation including programming write data into memory cells of a first word line from among a plurality of word lines included in a memory cell array of a memory device; and preforming a preliminary operation before performing the programming operation, the preliminary operation including, determining preliminary data based on the write data, and programming the preliminary data into memory cells of an adjacent word line, the adjacent word line being a word line, from among the plurality of word lines, that is adjacent to the first word line.

BRIEF DESCRIPTION OF THE DRAWINGS

The above and other features and advantages of example embodiments of the inventive concepts become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

FIG. 2 is disabled;

FIG. 2 is disabled;

FIG. 2 is enabled;

FIG. 2 is enabled;

FIGS. 17A to 16C illustrate another example of a pre-program operation process in a case where data to be written to a selection word line according to a first program command in an erased memory block in a memory system according to one or more embodiments is data of a plurality of pages;

DETAILED DESCRIPTION OF THE EMBODIMENTS

Figure 1:
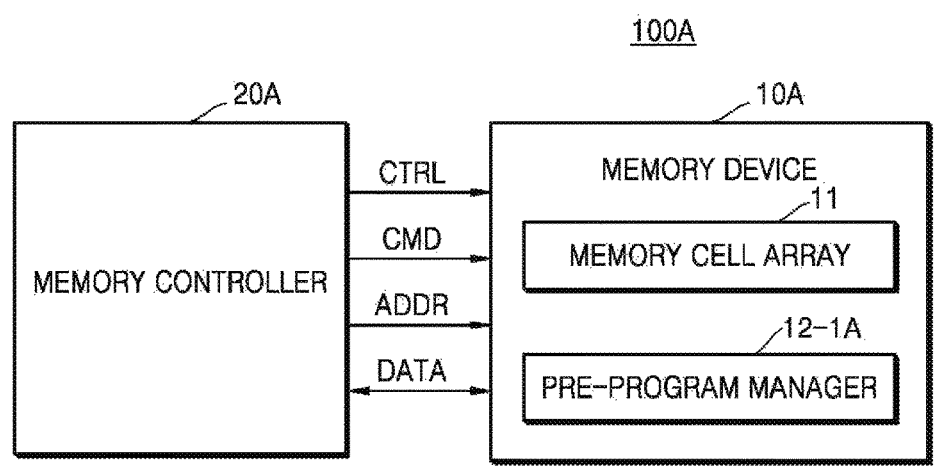
FIG. 1 is a schematic block diagram of a memory system according to an embodiment.

At least one example embodiment of the inventive concepts. As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a schematic block diagram of a memory system 100A according to an embodiment.

As illustrated in FIG. 1, the memory system 100A may include a memory device 10A and a memory controller 20A. The memory device 10A may include a memory cell array 11 and a pre-program manager 12-1A.

According to at least one example embodiment of the inventive concepts, the memory device 10A and memory controller 20A may each include or be implemented by one or more circuits or circuitry (e.g., hardware) specifically structured to carry out and/or control some or all of the operations described in the present disclosure as being performed by the memory device 10A (or an element thereof) or the memory controller 20A (or an element thereof). According to at least one example embodiment of the inventive concepts, the memory device 10A and memory controller 20A may each include or be implemented by a memory and one or more processors executing computer-readable code (e.g., software and/or firmware) that is stored in the memory and includes instructions for causing the one or more processors to carry out and/or control some or all of the operations described herein as being performed by the memory device 10A (or an element thereof) or the memory controller 20A (or an element thereof). According to at least one example embodiment of the inventive concepts, the memory device 10A and memory controller 20A may each be implemented by, for example, a combination of the above-referenced hardware and processors executing computer-readable code.

The term 'processor', as used in the present disclosure, may refer to, for example, a hardware-implemented data processing device having circuitry that is physically structured to execute desired operations including, for example, operations represented as code and/or instructions included in a program. Examples of the above-referenced hardware-implemented data processing device include, but are not limited to, a microprocessor, a central processing unit (CPU), a processor core, a multi-core processor; a multi-processor, an application-specific integrated circuit (ASIC), and a field programmable gate array (FPGA). Processors executing program code are programmed processors, and thus, are special-purpose computers.

The memory cell array 11 may include a plurality of memory cells respectively arranged in a plurality of areas where a plurality of word lines intersect a plurality of bit lines. In an embodiment, the plurality of memory cells may be flash memory cells. For example, the memory cell array 11 may be a NAND flash memory cell array or a NOR flash memory cell array. Hereinafter, a case where the plurality of memory cells are flash memory cells will be described as an example of the present embodiment.

The memory cell array 11 may have a string structure where a plurality of memory cells are serially connected to each other. For example, in each of a plurality of cell strings, a ground selection transistor, one or more dummy memory cells, a plurality of main memory cells, and a string selection transistor may be serially connected between a common source line CSL and a bit line BL. The one or more dummy memory cells may be arranged between the ground selection transistor and the plurality of main memory cells to decrease a coupling influence of the common source line CSL on the main memory cells. That is, a dummy memory cell may be disposed in an edge of a main memory cell.

As another example, in each cell string, a ground selection transistor, one or more dummy memory cells, a plurality of main memory cells, one or more dummy memory cells, and a string selection transistor may be serially connected between a common source line CSL and a bit line BL.

The main memory cells and the dummy memory cells connected to a plurality of bit lines may be respectively connected to different word lines. For example, a word line, to which the dummy memory cells are connected, may be referred to as a dummy word line.

In addition, in each cell string, a plurality of memory cells may be programmed in an order from a memory cell closest to a ground selection transistor connected to a global source line (GSL), in order to reduce back pattern dependency that is a drawback of the cell string structure. In this regard, the GSL may be referred to as a ground selection line.

For example, the memory cell array 11 may be designed to have a two-dimensional (2D) planar NAND flash memory cell structure. As another example, the memory cell array 11 may be designed to have a three-dimensional (3D) vertical NAND (VNAND) flash memory cell structure.

In the present embodiment, the memory cell array 11 having a 3D structure may be a circuit that includes an active area disposed on a silicon substrate and is associated with an operation of each memory cell, and may be configured in a monolithic type on a physical level of at least one memory cell array each including a circuit which is provided on or in the substrate. The term "monolithic type" may refer to a type of structure in which layers of each level constituting the array are stacked just on layers of each lower level of the array.

In an embodiment, the memory cell array 11 having a 3D structure may include vertical NAND strings which are arranged in a vertical direction in order for at least one memory cell to be disposed on another memory cell. The at least one memory cell may include a charge trap layer.

U.S. Pat. Nos. 7,679,133, 8,553,466, 8,654,587 and 8,559,235 and U.S. Patent Application No. 2011/0233648, each of which are incorporated herein by reference, disclose appropriate elements of a 3D memory array which includes a plurality of levels and has word lines and/or bit lines shared between the plurality of levels.

The pre-program manager 12-1A may include hardware or software for performing a program method of the memory device 10A, as is discussed in greater detail below with reference to the flowcharts of FIGS. 18 to 21.

According to at least some example embodiments of the inventive concepts, when valid data is not stored in memory cells of a word line adjacent to a selection word line where a program command is to be performed, the pre-program manager 12-1A performs, based on data to be written to the selection word line, a pre-program operation on the word line adjacent to the selection word line and then performs, based on the program command, a program operation on the selection word line. The term "pre-program operation" may be considered synonymous with, and may be referred to herein as, a "preliminary operation."

For example, before a program command for performing a first program operation on a memory block for which an erase operation has been performed is performed by the memory device 10A, the pre-program manager 12-1A performs a pre-program operation on a dummy word line adjacent to a selection word line that is designated by the program command. For example, the pre-program operation may perform an operation of writing, on the dummy word line adjacent to the selection word line, data which is the same as data to be written to the selection word line according to the program command. The data written to the dummy word line adjacent to the selection word line prior to the programming of the selection word line may also be referred to herein as "preliminary data."

The pre-program manager 12-1A may use a coarse program method and perform a pre-program operation. For example, the pre-program operation may set an increase range of a program voltage level according to a program loop change to be large, compared with a program operation according to a program command. For example, the pre-program operation may be performed using a one-time program pulse. For example, a program verification operation may not be performed in the pre-program operation. For example, when data that is to be programmed into a selection word line according to a program command is of two or more pages, data, which is written to a word line adjacent to the selection word line according to the pre-program operation, may be determined as data obtained by combining the data of two or more pages to be written to the selection word line. For example, when data that is to be programmed into a selection word line according to a program command is of two or more pages, data, which is written to a word line adjacent to the selection word line, may be determined as single-page data generated by combining the data of two or more pages to be written to the selection word line.

For example, a dummy memory cell of a dummy word line adjacent to a selection word line, where a pre-program operation is performed, may be between a main memory cell and a ground selection transistor of a cell string. For example, when a plurality of dummy memory cells are between a main memory cell and a ground selection transistor of a cell string included in a memory block, the pre-program manager 12-1A may perform a pre-program operation on a dummy memory cell that is nearest to (e.g., adjacent to) the main memory cell.

When a pre-program mode is enabled, the pre-program manager 12-1A may perform a pre-program operation. When the pre-program mode is disabled, the pre-program manager 12-1A may control a pre-program operation of the memory device 10A not to perform the pre-program operation. For example, according to at least some example embodiments of the inventive concepts, when the pre-program mode is disabled, the pre-program manager 12-1A may not perform the pre-program operation, such that the pre-program operation is not performed for the memory device 10A. For example, when a program/erase cycle count for each memory block is greater than an initially set threshold value, the pre-program manager 12-1A may set a corresponding memory block to a pre-program mode enabled state. As another example, in a test process or user environment, the pre-program mode may be set to be enabled. According to at least some example embodiments of the inventive concepts, when a program/erase cycle count for a memory block is not greater than an initially set threshold value, the pre-program manager 12-1A may not set the memory block to a pre-program mode enabled state, such that the pre-program mode is not enabled for the memory block.

The memory controller 20A may perform a control operation on the memory device 10A. In detail, the memory controller 20A may generate an address ADDR, a command CMD, and a control signal CTRL for controlling the memory device 10A. Also, the memory controller 20A may supply the address ADDR, the command CMD, and the control signal CTRL to the memory device 10A and thus may control a program (or write) operation, a read operation, and an erase operation with respect to the memory device 10A. Also, data DATA for the program operation and read data DATA may be transmitted or received between the memory controller 20A and the memory device 10A.

Figure 2:
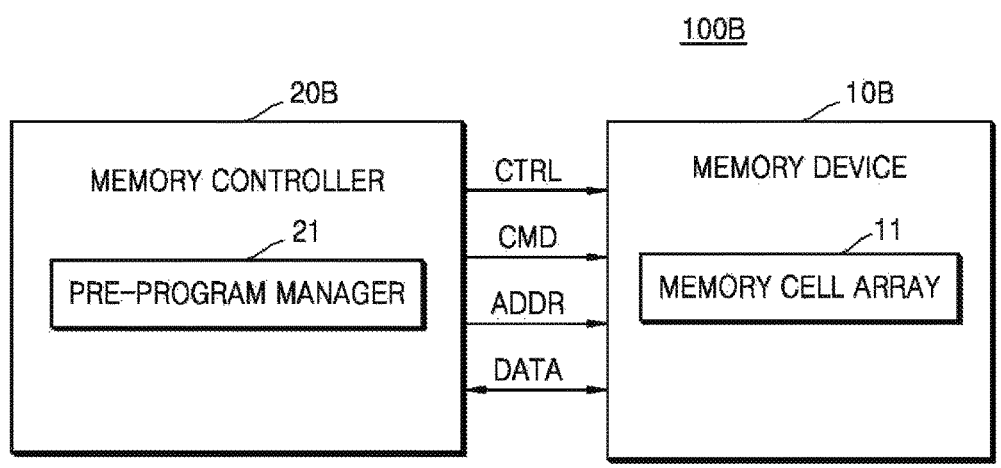
FIG. 2 is a schematic block diagram of a memory system according to another embodiment.

FIG. 2 is a schematic block diagram of a memory system 100B according to another embodiment.

As illustrated in FIG. 2, the memory system 100B may include a memory device 10B and a memory controller 20B. The memory device 10B may include a memory cell array 11, and the memory controller 20B may include a pre-program manager 21. According to at least one example embodiment of the inventive concepts, the memory device 10B and memory controller 20B may each include or be implemented by one or more circuits or circuitry (e.g., hardware) specifically structured to carry out and/or control some or all of the operations described in the present disclosure as being performed by the memory device 10B (or an element thereof) or the memory controller 20B (or an element thereof). According to at least one example embodiment of the inventive concepts, the memory device 10B and memory controller 20B may each include or be implemented by a memory and one or more processors executing computer-readable code (e.g., software and/or firmware) that is stored in the memory and includes instructions for causing the one or more processors to carry out and/or control some or all of the operations described herein as being performed by the memory device 10B (or an element thereof) or the memory controller 20B (or an element thereof). According to at least one example embodiment of the inventive concepts, the memory device 10B and memory controller 20B may each be implemented by, for example, a combination of the above-referenced hardware and processors executing computer-readable code.

A description of the memory cell array 11 of the memory device 10B has been provided above in the description of FIG. 1, and thus, is not repeated in the description of FIG. 2.

In the embodiment of FIG. 1, the pre-program manager 12-1A is provided in the memory device 10A, whereas, in the embodiment of FIG. 2, the pre-program manager 21 is provided in the memory controller 20B.

The memory controller 20B may perform a control operation on the memory device 10B. In detail, the memory controller 20B may generate an address ADDR, a command CMD, and a control signal CTRL for controlling the memory device 10B. Also, the memory controller 20B may supply the address ADDR, the command CMD, and the control signal CTRL to the memory device 10B and thus may control a program (or write) operation, a read operation, and an erase operation with respect to the memory device 10B. Also, data DATA for the program operation or a pre-program operation and read data DATA may be transmitted or received between the memory controller 20B and the memory device 10B.

The pre-program manager 21 may include hardware or software for performing a program method of the memory device 10B, as illustrated in the flowcharts of FIGS. 18 to 21.

When valid data is not stored in memory cells of a word line adjacent to a selection word line where a program command is to be performed, the pre-program manager 21 transmits a command, an address, and data for performing, based on data to be written to the selection word line, a pre-program operation on the word line adjacent to the selection word line to the memory device 10B before transmitting the program command to the memory device 10B. Thus, according to at least some example embodiments of the inventive concepts, the pre-program manager 21 may perform the pre-program operation (e.g., the preliminary operation) to program data (e.g., the preliminary data) into the word line adjacent to a selection word line by transmitting the command, in response to which the memory device 10B performs the pre-program operation on the word line adjacent to the selection word line.

When valid data is not stored in memory cells of a word line adjacent to a selection word line where a program command is to be performed, the memory controller 20B performs a pre-program operation and then transmits a command, an address, and data for a program operation on the selection word line to the memory device 10B.

For example, before transmitting a program command for performing a first program operation on a memory block for which an erase operation has been performed to the memory device 10B, the pre-program manager 21 may transmit a command, an address, and data for performing a pre-program operation on a dummy word line adjacent to a selection word line that is designated by the program command to the memory device 10B.

For example, the pre-program manager 21 may determine, as the data which is transmitted to the memory device 10B for performing a pre-program operation, data that is the same as data to be written to a selection word line according to a program command.

The pre-program manager 21 may control the memory device 10B to perform a pre-program operation by using a coarse program method. For example, the pre-program manager 21 may set, in the pre-program operation, an increase range of a program voltage level according to a program loop change to be large, compared with a program operation according to a program command. For example, the pre-program manager 21 may control the memory device 10B to perform the pre-program operation by using a one-time program pulse. For example, the pre-program manager 21 may control the memory device 10B not to perform a program verification operation in the pre-program operation. For example, when data that is to be programmed into a selection word line according to a program command is of two or more pages, the pre-program manager 21 may determine data, which is written to a word line adjacent to the selection word line according to the pre-program operation, as data obtained by combining the data of two or more pages to be written to the selection word line. For example, when data that is to be programmed into a selection word line according to a program command is of two or more pages, data, which is written to a word line adjacent to the selection word line, may be determined as single-page data generated by combining the data of two or more pages to be written to the selection word line.

For example, a dummy memory cell of a dummy word line in the memory device 10B, where a pre-program operation is performed by the pre-program manager 21, may be between a main memory cell and a ground selection transistor of a cell string. For example, according to at least some example embodiments of the inventive concepts, when a plurality of dummy memory cells are between a main memory cell and a ground selection transistor of a cell string included in a memory block of the memory device 10B, the pre-program manager 21 may control the memory device 10B to perform a pre-program operation on a dummy memory cell that is nearest to (e.g., adjacent to) the main memory cell.

When a pre-program mode is enabled, the pre-program manager 21 may perform a pre-program operation. When the pre-program mode is disabled, the pre-program manager 21 may control the memory device 10B not to perform the pre-program operation. For example, when a program/erase cycle count for each memory block is greater than an initially set threshold value, the pre-program manager 21 may set a corresponding memory block to a pre-program mode enabled state. According to at least some example embodiments of the inventive concepts, when a program/erase cycle count for a memory block is not greater than an initially set threshold value, the pre-program manager 21 may not set the memory block to a pre-program mode enabled state, such that the pre-program mode is not enabled for the memory block. As another example, in a test process or user environment, the pre-program mode may be set to be enabled.

Figure 3:
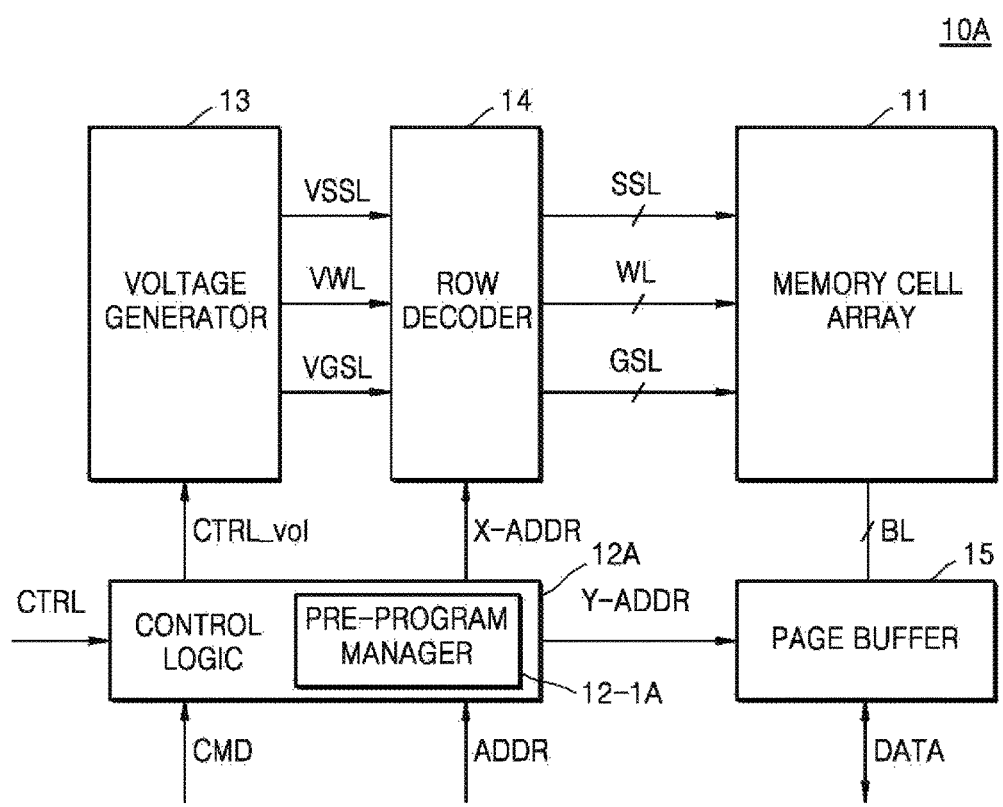
FIG. 3 is a detailed block diagram of a memory device included in the memory system of FIG. 1.

FIG. 3 is a detailed block diagram of the memory device 10A included in the memory system 100A of FIG. 1.

Referring to FIG. 3, the memory device 10A may include the memory cell array 11, a control logic 12A, a voltage generator 13, a row decoder 14, and a page buffer 15.

The memory cell array 11 may be connected to one or more string selection lines SSL, a plurality of word lines WL, and one or more ground selection lines GSL and may also be connected to a plurality of bit lines BL. The memory cell array 11 may include a plurality of memory cells respectively arranged in a plurality of areas where the plurality of word lines WL intersect the plurality of bit lines BL. The plurality of word lines WL may include a plurality of main word lines MWL and one or more dummy word lines DWL. The one or more dummy word lines DWL enhance data reliability of a main word line.

When an erase voltage is applied to the memory cell array 11, a plurality of memory cells MC may be set to an erase state as a result. When a program voltage is applied to the memory cell array 11, the plurality of memory cells MC may be set to a program state as a result. In this case, each of the memory cells MC may have one of the erase state and first to nth program states P1 to Pn which are classified based on a threshold voltage.

In this regard, n may be a natural number equal to or greater than two. For example, when each of the memory cells MC is a two-bit level cell (e.g., a memory cell storing two-bit data), n may be three. As another example, when each of the memory cells MC is a three-bit level cell (e.g., a memory cell storing three-bit data), n may be seven. As another example, when each of the memory cells MC is a four-bit level cell (e.g., a memory cell storing four-bit data), n may be fifteen. As described above, the plurality of memory cells MC may include multi-level cells. However, at least some example embodiments of the inventive concepts are not limited thereto. In some embodiments, the plurality of memory cells MC may include single level cells.

The control logic 12A may output various control signals for writing data to the memory cell array 11, reading the data from the memory cell array 11, or erasing the memory cell array 11, based on a command CMD, an address ADDR, and a control signal CTRL received from the memory controller 20A. Thus, the control logic 12A may overall control various operations of the memory device 10A.

The control logic 12A includes the pre-program manager 12-1A. When valid data is not stored in memory cells of a word line adjacent to a selection word line where a program command received from the memory controller 20A is to be performed, the pre-program manager 12-1A may generate control signals for performing, based on data to be written to the selection word line, a pre-program operation on the word line adjacent to the selection word line and then performing, based on the program command, a program operation on the selection word line. For ex e, the pre-program manager 12-1A may generate control signals for performing a coarse pre-program operation.

The control signals generated from the control logic 12A may be supplied to the voltage generator 13, the row decoder 14, and the page buffer 15. For example, the control logic 12A may supply a voltage control signal CTRL_vol to the voltage generator 13, supply a row address dX_ADDR to the row decoder 14, and supply a column address Y_ADDR to the page buffer 15.

The voltage generator 13 may generate various kinds of voltages for performing a pre-program operation, a program operation, a read operation, and an erase operation on the memory cell array 11, based on the voltage control signal CIRL_vol. In detail, the voltage generator 13 may generate a first driving voltage VWL for driving the plurality of word lines WL, a second driving voltage VSSL for driving the plurality of string selection lines SSL, and a third driving voltage VGSL for driving the plurality of ground selection lines GSL.

In this case, the first driving voltage VWL may be a pre-program voltage, a program voltage (or a write voltage), a read voltage, an erase voltage, a pass voltage, or a program verification voltage. Also, the second driving voltage VSSL may be a string selection voltage, namely, an on voltage or an off voltage. Furthermore, the third driving voltage VGSL may be a ground selection voltage, namely, an on voltage or an off voltage.

The row decoder 14 may be connected to the memory cell array 11 via the plurality of word lines WL and may activate some of the plurality of word lines WL in response to the row address X_ADDR received from the control logic 12A. In detail, in the read operation, the row decoder 14 may apply the read voltage to a selected word line and may apply the pass voltage to an unselected word line.

In the pre-program operation or program operation, the row decoder 14 may apply the program voltage to a selected word line (e.g., a word line selected as the word line upon which the pre-program operation is to be performed) and may apply the pass voltage to an unselected word line.

In addition, in the erase operation, the row decoder 14 may apply the erase voltage (for example, 0 V) to the word lines WL and may float each of the string selection line SSL and the ground selection line GSL.

The page buffer 15 may be connected to the memory cell array 11 via the plurality of bit lines BL. In detail, in the read operation, the page buffer 15 may operate as a sense amplifier to output data DATA stored in the memory cell array 11. In the pre-program operation or program operation, the page buffer 15 may operate as a write driver to input data DATA, which is to be stored in the memory cell array 11, to the memory cell array 11.

Figure 4:
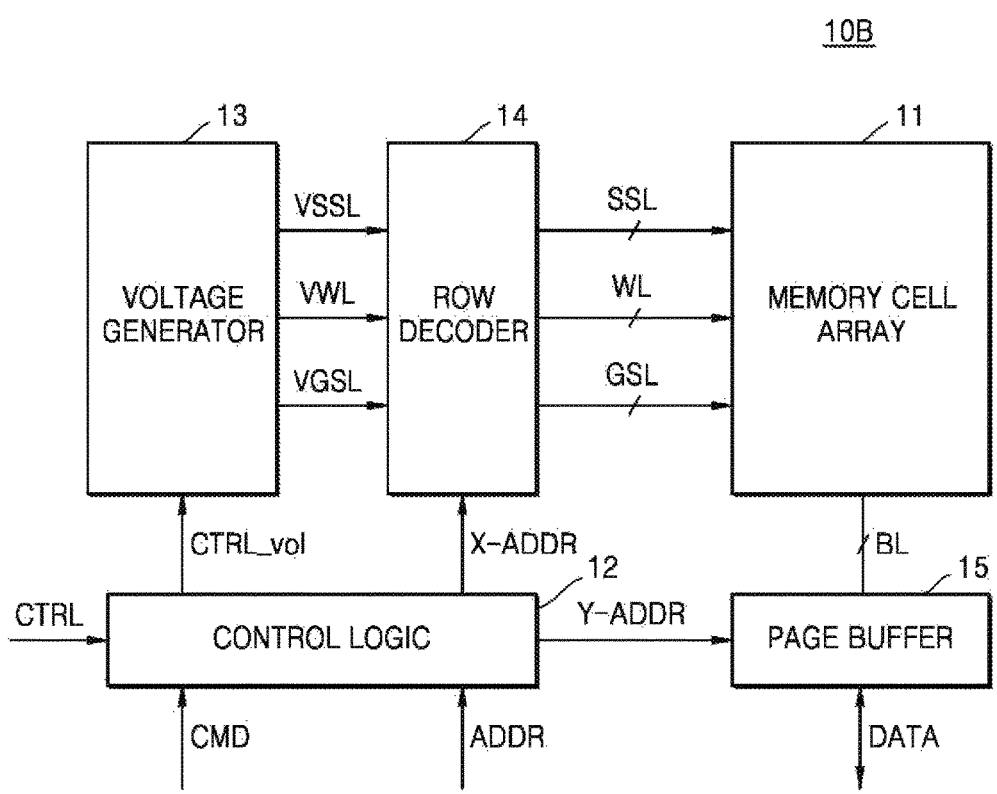
FIG. 4 is a detailed block diagram of a memory device included in the memory system of FIG. 2.

FIG. 4 is a detailed block diagram of the memory device 10B included in the memory system 100B of FIG. 2.

Referring to FIG. 4, the memory device 10B may include a memory cell array 11, a control logic 12, a voltage generator 13, a row decoder 14, and a page buffer 15. The memory cell array 11, the voltage generator 13, the row decoder 14, and the page buffer 15 have been described above with reference to FIG. 3, and thus, their repetitive descriptions are not provided.

In addition, the control logic 12 may have a configuration where the pre-program manager 12-1A of the control logic 12A illustrated in FIG. 3 is omitted. The control logic 12 may output various control signals for writing data to the memory cell array 11, reading the data from the memory cell array 11, or erasing the memory cell array 11, based on a command CMD, an address ADDR, and a control signal CTRL received from the memory controller 20B. Thus, the control logic 12 may perform overall control of various operations of the memory device 10B.

Figure 5:
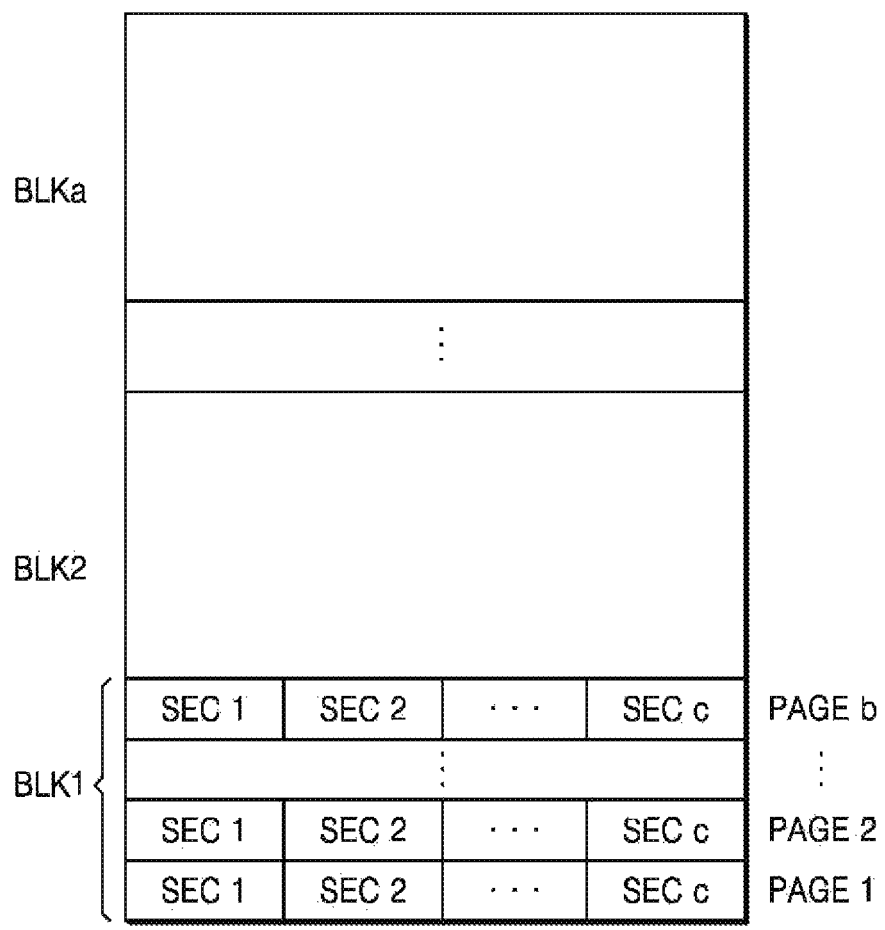
FIG. 5 illustrates an example of a memory cell array illustrated in FIG. 3 or FIG. 4.

FIG. 5 illustrates an example of the memory cell array 11 illustrated in FIG. 3 or FIG. 4.

Referring to FIG. 5, the memory cell array 11 may be a flash memory cell array. In this case, the memory cell array 11 may include a (where a is an integer equal to or greater than two) number of memory blocks BLK1 to BLKa. Each of the memory blocks BLK1 to BLKa may include b (where b is an integer equal to or greater than two) number of pages PAGE1 to PAGEb. Each of the pages PAGE1 to PAGEb may include c (where c is an integer equal to or greater than two) number of sectors SEC1 to SECc. In FIG. 5, for convenience of illustration, only the memory block BLK1 is illustrated as including the pages PAGE1 to PAGEb and the sectors SEC1 to SECc. However, the other memory blocks BLK2 to BLKa may each have the same structure as the memory block BLK1.

Figure 6:
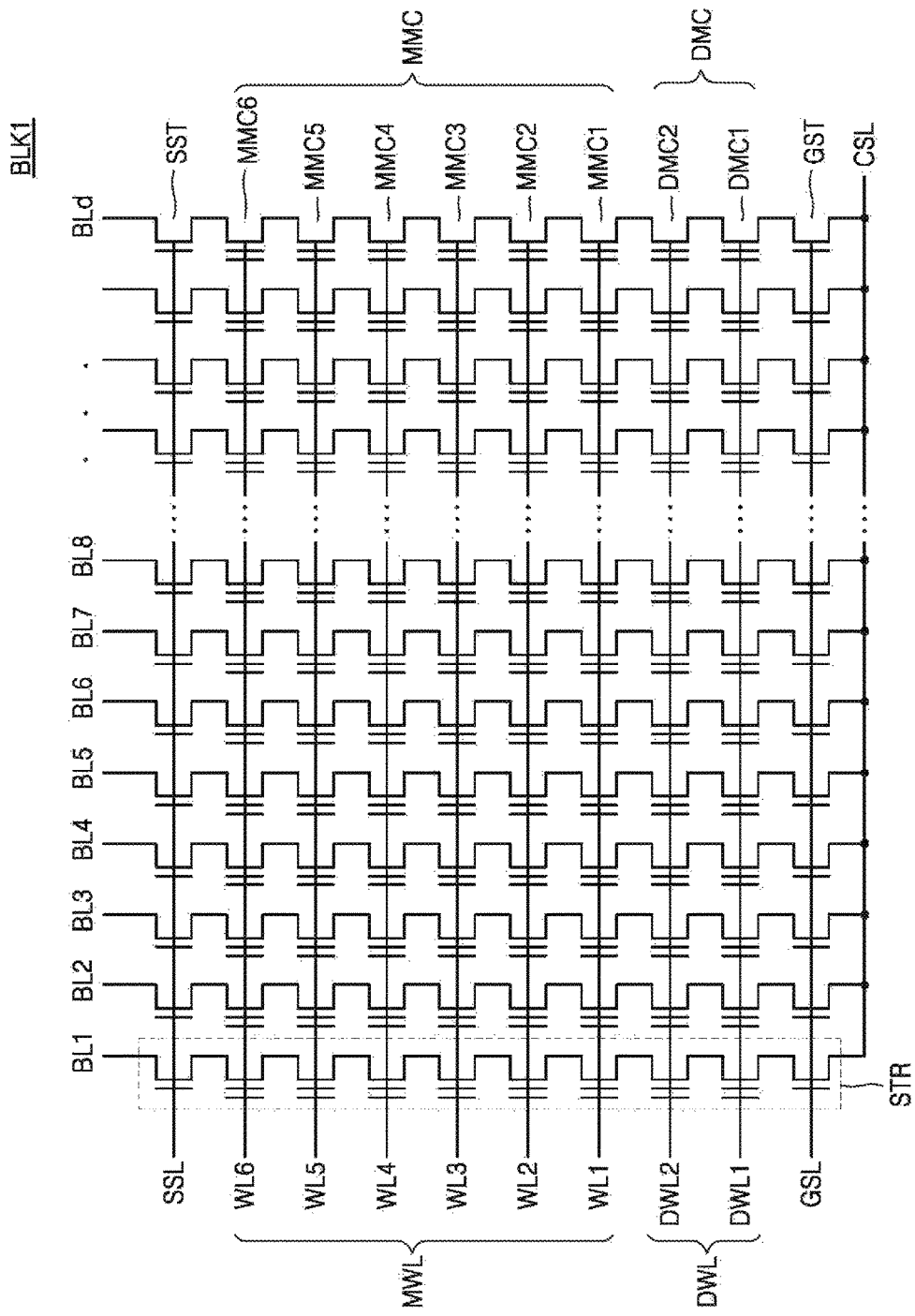
FIG. 6 is a circuit diagram illustrating an example of a memory block included in the memory cell array illustrated in FIG. 5.

FIG. 6 is a circuit diagram illustrating an example of the memory block BLK1 included in the memory cell array 11 illustrated in FIG. 5.

Referring to FIG. 6, a first memory block BLK1 may be a NAND flash memory having a vertical structure, and each of the memory blocks BLK1 to BLKa illustrated in FIG. 5 may be implemented as in FIG. 6. The first memory block BLK1 may include, for example, d (where d is an integer equal to or greater than two) number of cell strings STR where eight memory cells are serially connected to each other. Each of the string cells STR may include a string selection transistor SST and a ground selection transistor GST which are respectively connected to both ends of memory cells serially connected to each other. In this regard, one or more memory cells adjacent to the ground selection transistor GST among eight memory cells included in one cell string may each be set as a dummy memory cell.

In the embodiment of FIG. 6, two memory cells adjacent to the ground selection transistor GST may each be set as a dummy memory cell DMC. Accordingly, six of the eight memory cells included in one cell string may each be set as a main memory cell MMC. Though not illustrated in FIG. 6, according to at least some example embodiments of the inventive concepts, one or more dummy memory cells DMC may be added between the string selection transistor SST and the main memory cell MMC for one or more of the cell strings STR.

In addition, a dummy word line DWL may be connected to the dummy memory cell DMC, and a main word line MWL may be connected to the main memory cell MMC. As described above, the dummy memory cell may be between the ground selection transistor GST and a plurality of main memory cells MMC1 to MMC6 in order to decrease a coupling influence of the common source line CSL on the main memory cells. That is, one or more dummy memory cells may be arranged in an edge of the main memory cell.

In this regard, the number of cell strings STR, the number of dummy word lines DWL, the number of main word lines MWL, and the number of bit lines BL may be variously changed according to embodiments.

An NAND flash memory device having a structure illustrated in FIG. 6 may be erased in a memory block unit and may be programmed in a page unit corresponding to each word line. For example, when a memory cell is a single level cell, one page may correspond to each word line. As another example, when the memory cell is a multi-level cell or a triple-level cell, a plurality of pages may correspond to each word line.

Figure 7:
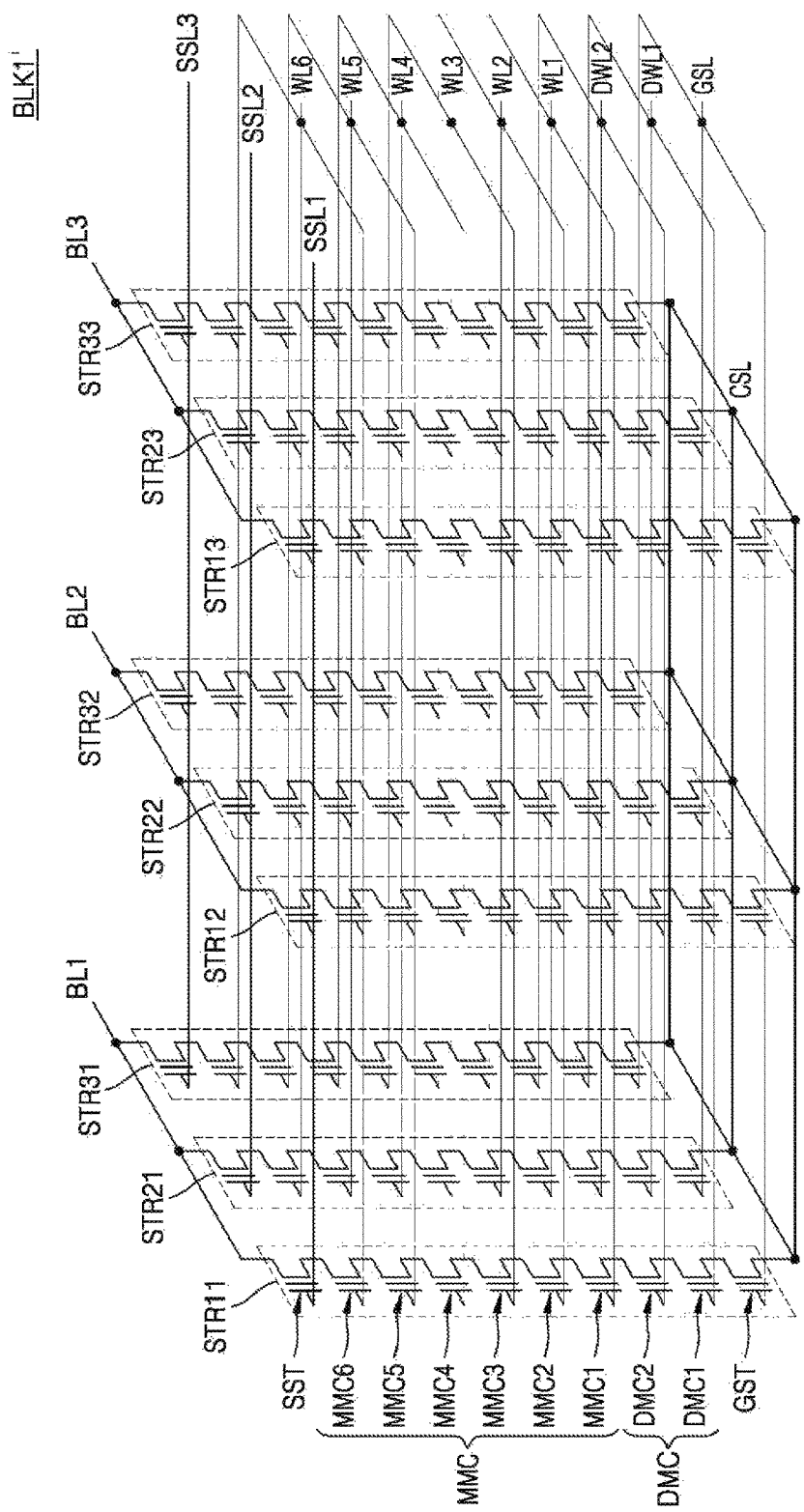
FIG. 7 is a circuit diagram illustrating another example of a memory block included in the memory cell array illustrated in FIG. 5.

FIG. 7 is a circuit diagram illustrating another example of the memory block included in the memory cell array illustrated in FIG. 5.

FIG. 7 is a circuit diagram illustrating another example BLK' of the memory block included in the memory cell array 11 of FIG. 5.

Referring to FIG. 7, a first memory block BLK1' may be a NAND flash memory having a vertical structure, and each of the memory blocks BLK1 to BLKa illustrated in FIG. 5 may be implemented as in FIG. 7. The first memory block BLK1' may include, for example, a plurality of cell strings STR11 to STR33, a plurality of word lines DWL1, DWL2 and WL1 to WL6, a plurality of bit lines BL1 to BL3, a ground selection line GSL, a plurality of string selection lines SSL1 to SSL3, and a common source line CSL. In this regard, the number of cell strings, the number of word lines, the number of bit lines, the number of ground selection lines, and the number of string selection lines may be variously changed according to embodiments.

The cell strings STR11 to STR33 may be connected between the bit lines BL1 to BL3 and the common source line CSL. Each cell string (for example, STR11) may include a string selection transistor SST, a plurality of memory cells DMC and MMC, and a ground selection transistor GST, which are serially connected to each other.

In the embodiment of FIG. 7, two memory cells adjacent to the ground selection transistor GST in each cell string may each be set as a dummy memory cell DMC. Accordingly, six of eight memory cells included in one cell string may each be set as a main memory cell MMC. Though not illustrated in FIG. 7, according to at least some example embodiments of the inventive concepts, one or more dummy memory cells DMC may be added between the string selection transistor SST and the main memory cell MMC for one or more of the cell strings STR.

The string selection transistor SST may be connected to the string selection lines SSL1 to SSL3. A plurality of memory cells MC1 to MC8 may be respectively connected to a plurality of word lines WL1 to WL8 corresponding thereto. The ground selection transistor GST may be connected to the ground selection line GSL. The string selection transistor SST may be connected to a bit line BL corresponding thereto, and the ground selection transistor GST may be connected to the common source line CSL.

Word lines (for example, WL1) of the same height may be connected in common, and the string selection lines SSL1 to SSL3 may be spaced apart from each other. When memory cells, which are connected to the word line WL1 and included in the cell strings STR11 to STR13, are programmed, the word line WL1 and the string selection line SSL1 may be selected.

Figure 8:
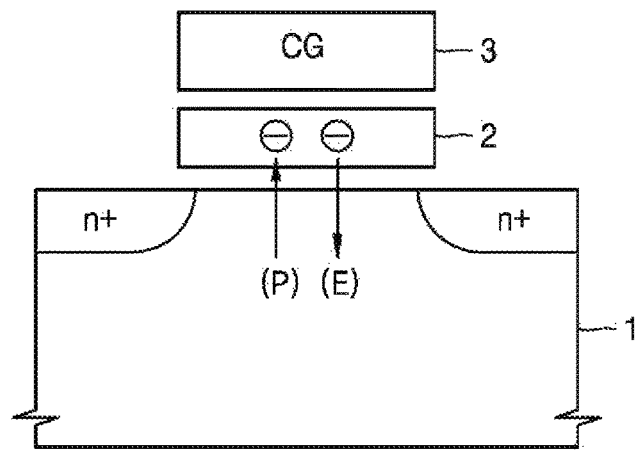
FIG. 8 is a cross-sectional view illustrating an example of a memory cell included in the memory block illustrated in FIG. 6 or FIG. 7.

FIG. 8 is a cross-sectional view illustrating an example of a memory cell included in the memory block illustrated in FIG. 6 or FIG. 7. In this regard, the memory cell may be a dummy memory cell DMC or a main memory cell MMC.

Referring to FIG. 8, the memory cell may include a channel area 1, a charge storage layer 2, and a control gate (CG) 3. For example, the charge storage layer 2 may be implemented with a floating gate which is a conductor, and a memory cell having such a structure may be referred to as a floating gate structure cell. As another example, the charge storage layer 2 may be implemented with a nonconductor, for example, SiN, and a memory cell having such a structure may be referred to as a charge trap flash (CTF) cell.

In order to perform a program operation on a memory cell, a relatively high program voltage may be applied to the CG 3, and a relatively low voltage (for example, 0 V) may be applied to the channel area 1. As, based on such a bias condition, an electric field is generated in a direction from the CG 3 to the channel area 1, electric charges, for example, electrons, may move in an arrow P direction (a direction from the channel area 1 to the charge storage layer 2), and accordingly, the memory cell may be programmed.

In addition, in order to perform an erase operation on the memory cell, a relatively low erase voltage (for example, 0 V) may be applied to the CG 3, and a relatively high voltage may be applied to the channel area 1. As, based on such a bias condition, an electric field is generated in a direction from the channel area 1 to the CG 3, electric charges, for example, electrons, may move in an arrow E direction (a direction from the charge storage layer 2 to the channel area 1), and accordingly, the memory cell may be erased.

Figure 9:
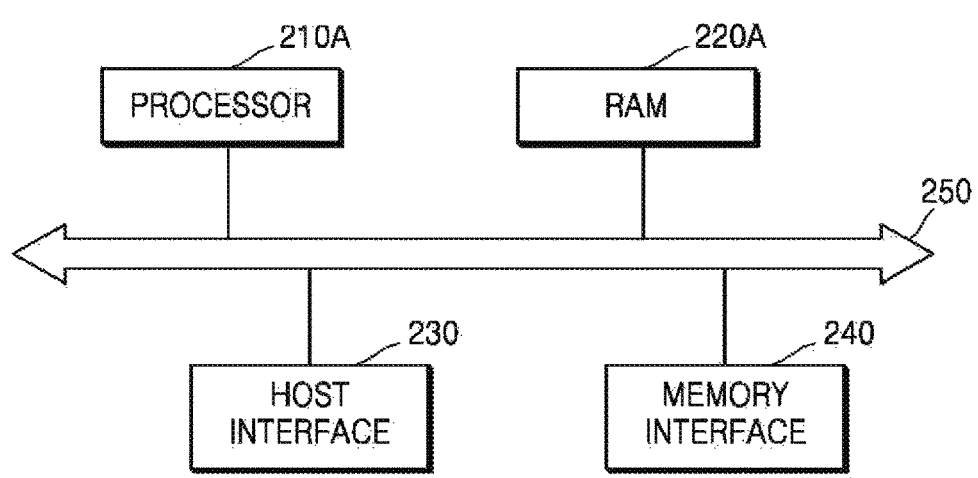
FIG. 9 illustrates an example of block configuration of a memory controller illustrated in FIG. 1.

FIG. 9 illustrates an example of a block configuration of the memory controller 20A illustrated in FIG. 1.

As illustrated in FIG. 9, the memory controller 20A may include a processor 210A, random access memory (RAM) 220A, a host interface 230, a memory interface 240, and a bus 250.

The elements of the memory controller 20 may be electrically connected to each other through the bus 250.

The processor 210A may control an overall operation of the memory system 100A by using a program code and items of data which are stored in the RAM 220A. For example, the processor 210A may be implemented with a microprocessor or a central processing unit (CPU). In initializing the memory system 100A, the processor 210A may read, from the memory device 10A, a program code and items of data necessary for controlling operations which are performed in the memory system 100A and may load the program code and the items of data into the RAM 220A.

The processor 210A may provide a read command and an address to the memory device 10A in a read operation, provide a program command, an address, and data to the memory device 10A in a program operation, and provide an erase command and an address to the memory device 10A in an erase operation. Also, the processor 210A may convert a logical address which is received from a host into a physical address by using system data stored in the RAM 220A.

The host interface 230 may include a protocol for exchanging data with the host which is connected to the memory system 100A and may connect the memory system 100A and the host to each other. According to at least some example embodiments, the memory interface 230 may be embodied by one or more circuits or circuitry. The host interface 230 may be implemented with an advanced technology attachment (ATA) interface, a serial-ATA (SATA) interface, a parallel-ATA (PATA) interface, a universal serial bus (USB), a serial attached small computer system (SAS) interface, a small computer system interface (SCSI), an embedded multi-media card (eMMC) interface, or a universal flash storage (LTFS) interface. However, this is merely an example, and at least some example embodiments of the inventive concepts are not limited thereto. The host interface 230 may receive a command, an address, and data from the host or may transmit data to the host according to control by the processor 210A.

The memory interface 240 may be electrically connected to the memory device 10A. According to at least some example embodiments, the memory interface 240 may be embodied by one or more circuits or circuitry. The memory interface 240 may transmit a command, an address, and data to the memory device 10A or may receive data from the memory device 10A according to control by the processor 210A. The memory interface 240 may be configured to support an NAND flash memory or a NOR flash memory. The memory interface 240 may be configured to perform software or hardware interleaving operations through a plurality of channels.

Figure 10:
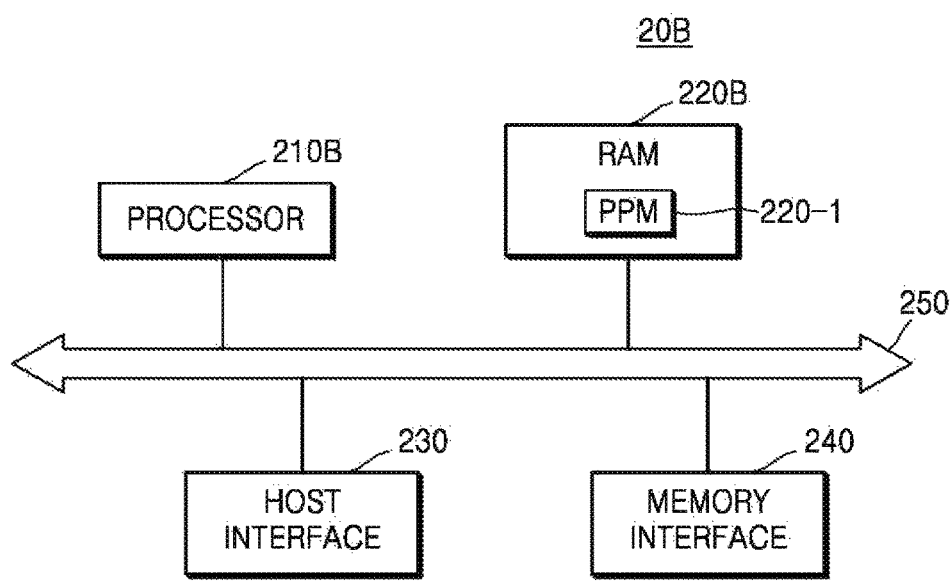
FIG. 10 illustrates an example of block configuration of a memory controller illustrated in FIG. 2.

FIG. 10 illustrates an example of a block configuration of the memory controller 20B illustrated in FIG. 2.

As illustrated in FIG. 10, the memory controller 20B may include a processor 210B, a RAM 220B, the host interface 230, the memory interface 240, and the bus 250.

A program code and items of data necessary for controlling operations which are performed in the memory system 100B, may be stored in the RAM 220B. For example, in initializing the memory system 100B, the processor 210B may read, from the memory device 10B, the program code and the items of data necessary for controlling the operations which are performed in the memory system 100B and may load the program code and the items of data into the RAM 220B. Particularly, the RAM 220B may store a program code (PPM) 220-1 for performing a pre-program management operation.

The processor 210B may control an overall operation of the memory system 100B by using the program code and the items of data stored in the RAM 220B. For example, the processor 210B may perform the operation of the pre-program manager 21 as described above with reference to FIG. 2 by using the PPM 220-1 stored in the RAM 220B. For example, the processor 210B may perform a program management method of a memory device, as illustrated in the flowcharts of FIGS. 18 to 21, by using the PPM 220-1 stored in the RAM 220B.

Descriptions of the host interface 230, the memory interface 240, and the bus 250 are provided above in the description of FIG. 9, and thus, are not repeated in the description of FIG. 10.

Figure 11:
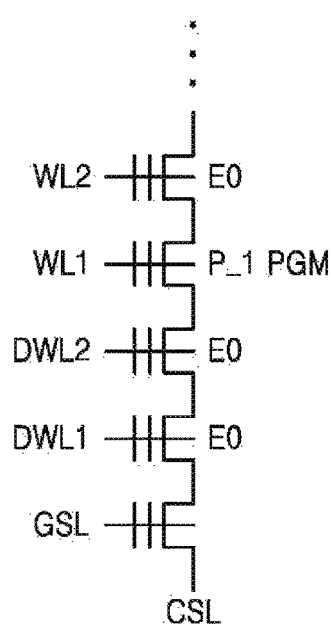
FIG. 11 illustrates an initial program state after an erase operation and an initial program operation in one cell string included in an erased memory block of FIG. 6 or FIG. 7 under a condition where a pre-program mode in the memory system of FIG. 1

FIG. 11 illustrates an initial program state after an erase operation and an initial program operation in one cell string included in the memory block of FIG. 6 or FIG. 7 under a condition where a pre-program mode in the memory system 100A or 100B of FIG. 1 or FIG. 2 is disabled.

Referring to FIG. 11, a cell string may have a string structure where a plurality of memory cells are serially connected to each other. For example, two dummy memory cells DMC1 and DMC2 may be arranged between a ground selection transistor and a main memory cell MMC1, in order to decrease an influence of a common source line CSL on a main memory cell MMC. Also, a plurality of memory cells may be programmed in an order from a memory cell closest to a ground selection line GSL. In FIG. 11, the dummy memory cells DMC1 and DMC2 may be respectively connected to dummy word lines DWL1 and DWL2.

Accordingly, an erase operation may be performed under a condition where a pre-program mode in a memory system is disabled, and then, an initial program operation may be performed for the main memory cell MMC1 close to the ground selection line GSL. That is, the main memory cell MMC1 which is first connected to the word line WL1 after the erase operation may be programmed (P_1 PGM).

Since memory cells that are connected to upper/lower word lines adjacent to the word line WL1 for which a program operation is first performed after the erase operation have all been erased, influence of adjacent word lines on the word line WL1 is different from influence of adjacent word lines on another word line having data written to at least one of the adjacent word lines. A word line having adjacent word lines all erased may reach a target threshold voltage only if a larger amount of electrons are injected into the word line than other word lines (e.g., word lines that have adjacent programmed word lines), due to a high floating gate potential of memory cells of the adjacent word lines. Thus, memory cells of the word line WL1 for which an initial program after the erase operation is performed may have worse reliability characteristics, such as endurance/retention, compared with memory cells of other word lines.

Figure 12:
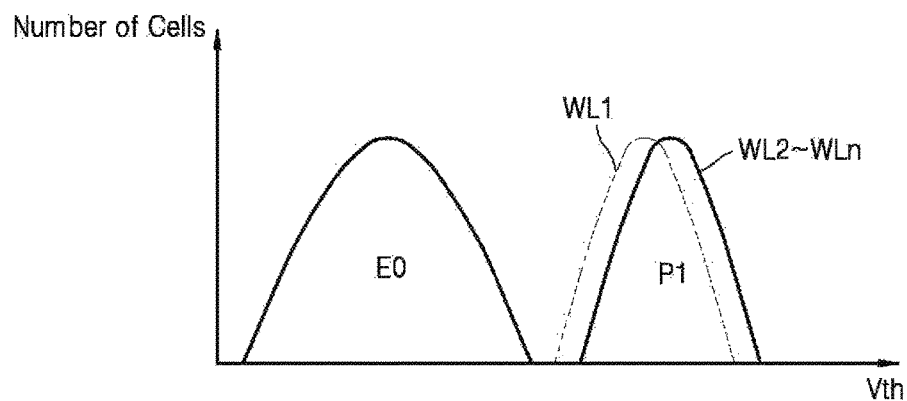
FIG. 12 illustrates retention characteristics of memory cells for each word line in a memory block where a program operation has been executed under the condition where a pre-program mode in the memory system of FIG. 1

FIG. 12 illustrates retention characteristics of memory cells for each word line in a memory block where a program operation has been executed under the condition where a pre-program mode in the memory system 100A or 100B of FIG. 1 or FIG. 2 is disabled. For example, a threshold voltage state of memory cells for each word line after performing a program operation under a condition where a pre-program mode is disabled.

Referring to FIG. 12, it may be found that a threshold voltage variation of a program state P1 of memory cells connected to a main word line WL1 is shifted toward a threshold voltage of an erase state E0, compared with a threshold voltage variation of a program state P1 of memory cells connected to main word lines WL2 to WLn (where n is an integer equal to or greater than three). Since the main word line WL1 is programmed in a state where adjacent pages are all erased, the most trapped charges may be used in order to program a page of the main word line WL1 first, after the erase operation. For this reason, as shown in FIG. 12, reliability of the memory cells connected to the main word line WL1 is the lowest in the cell string.

FIG. 113 illustrates a program process after an erase operation with respect to one cell string included in the memory block illustrated in FIG. 6 or FIG. 7 under a condition where a pre-program mode is enabled in the memory system 100A or 100B of FIG. 1 or FIG. 2.

Figures 13A, 13B, 13C:
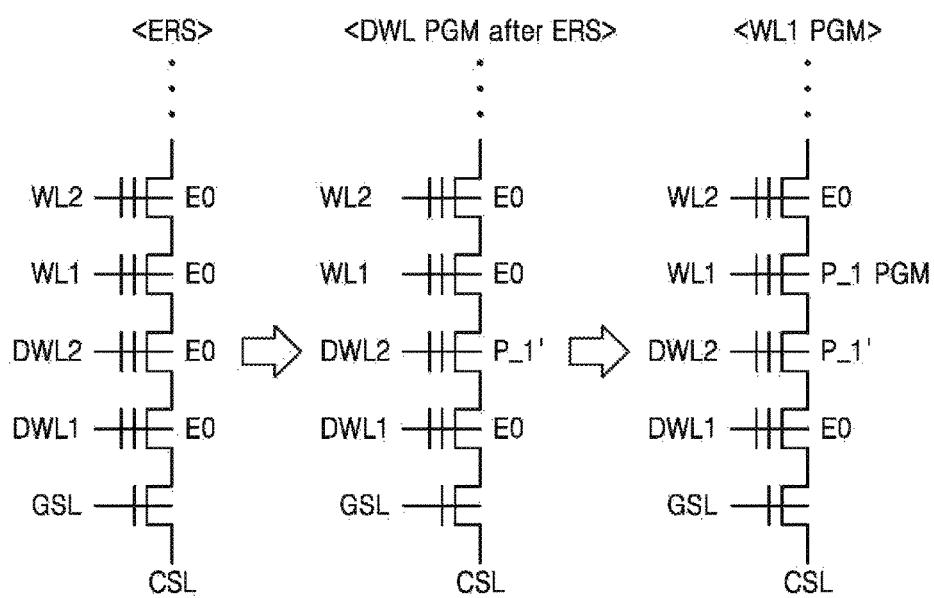
FIGS. 13A to 13C illustrate a program process after an erase operation with respect to one cell string included in the memory block of FIG. 6 or FIG. 7 under a condition where a pre-program mode in the memory system of FIG. 1

FIG. 13A shows states of a dummy memory cell DMC and a main memory cell MMC included in a cell string included in a memory block for which an erase operation has been performed. That is, main memory cells MMC1 to MMCn of main word lines WL1 to WLn and dummy memory cells DMC1 and DMC2 which are connected to dummy word lines DWL1 and DWL2 after the erase operation is performed may all have a threshold voltage of an erase state E0.

FIG. 13B shows a state where data which is the same as one to be written to a main word line WL1 is written to a dummy memory cell DMC2 adjacent to a main memory cell of a cell string, before a program operation in the main word line WL1 is performed according to a program command as a pre-program mode is performed after the erase operation. That is, the dummy memory cell DMC2 connected to a dummy word line DWL2 adjacent to the main word line WL1 may be pre-programmed (P_1') before a program operation is performed with respect to the main word lines WL1 to WLn after the erase operation is performed.

FIG. 13C shows a state PGM where a first main memory cell MMC1 of a cell string is programmed after the pre-program mode is performed. That is, FIG. 13C shows a state where, after the erase operation is performed, the dummy memory cell DMC2 connected to the dummy word line DWL2 adjacent to the main word line WL1 is pre-programmed, and then, the main memory cell MMC1 connected to the main word line WL1 is programmed.

Figure 14:
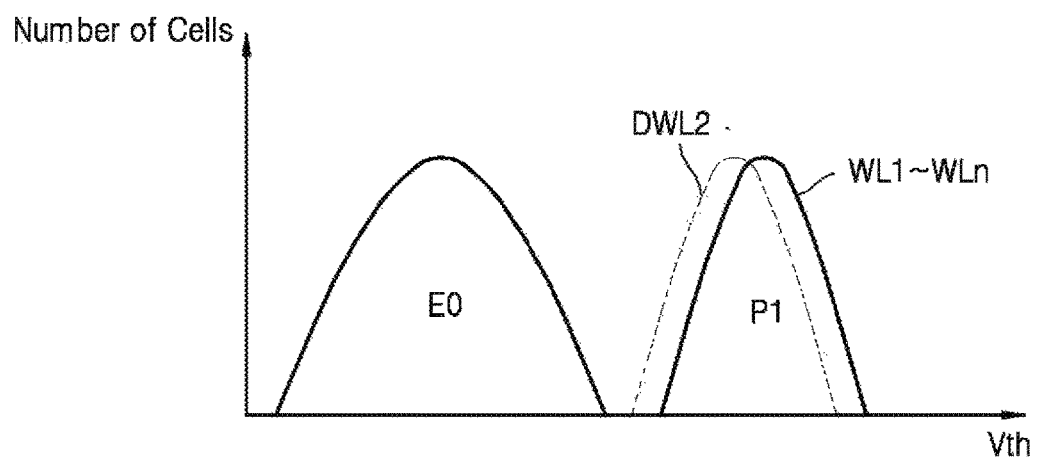
FIG. 14 illustrates retention characteristics of memory cells for each word line in a memory block where a program operation has been executed under the condition where a pre-program mode in the memory system of FIG. 1

FIG. 14 illustrates retention characteristics of memory cells for each word line in a memory block where a program operation has been executed under the condition where a pre-program mode is enabled in the memory system 100A or 100B of FIG. 1 or FIG. 2. In detail, a threshold voltage state of memory cells for each word line after performing a program operation under a condition where a pre-program mode is enabled and then performing a read operation as much as initially set times in poor surroundings is illustrated.

Referring to FIG. 14, it may be found that a threshold voltage variation of a program state P1 of memory cells connected to a dummy word line DWL2 which has been programmed by a pre-program operation is shifted toward a threshold voltage of an erase state E0, compared with a threshold voltage variation of a program state P1 of memory cells connected to main word lines WL1 to WLn (where n is an integer equal to or greater than three). Since the dummy word line DWL2 is programmed in a state where adjacent pages are all erased, the most charge traps may be used in order to first program a page of the dummy word line DWL2 after the erase operation. For this reason, as shown in FIG. 14, reliability of the memory cells connected to the dummy word line DWL2 is the lowest in a cell string, whereas reliability of the memory cells connected to a first main word line WL1 is enhanced.

That is, reliability of the memory cells connected to the main word lines WL1 to WLn is enhanced by performing a program operation on the memory cells connected to the dummy word line DWL2 through a pre-program operation after the erase operation.

A process of performing a program operation in a word line according to a first program command in an erased memory block in a memory system will be described with reference to FIGS. 15 to 17.

FIGS. 15 to 17 each illustrate, for convenience of description, a program state of four memory cells for each word line. A memory system to which at least one example embodiment of the inventive concepts is applied may have a structure in which four or more memory cells are connected with respect to each word line.

In addition, FIGS. 16 and 17 each illustrate a case where a plurality of pages are programmed to one word line by using a one-step program method. According to another embodiment, a program operation may be performed by a multi-step program method according to a reprogramming operation.

Figure 15A:
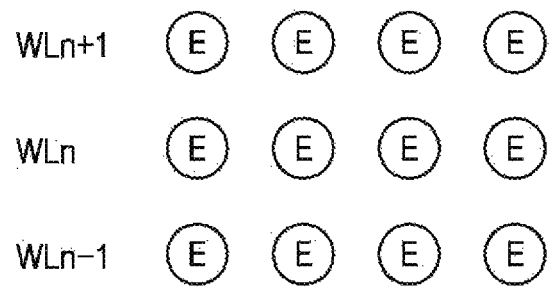
FIGS. 15A to 15C illustrate an example of a pre-program operation process in a case where data to be written to a selection word line according to a first program command in an erased memory block in a memory system according to one or more embodiments is data of a single page.
Figure 15B:
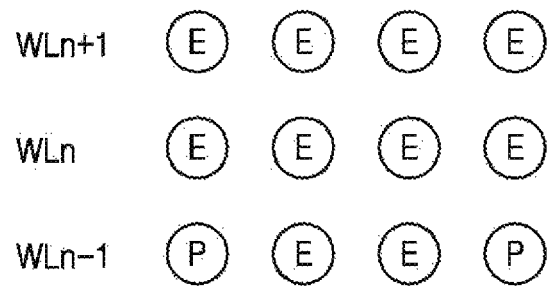
Figure 15C:
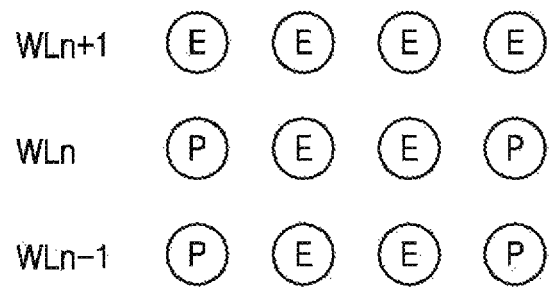

FIGS. 15A to 15C illustrate an example of a pre-program operation process in a case where data to be written to a selection word line according to a first program command in an erased memory block in a memory system according to one or more embodiments is data of a single page.

FIG. 15A shows a program state of memory cells connected to word lines WLn−1, WLn, and WLn+1 of a memory block for which an erase operation has been performed. Since the erase operation has been performed, all the memory cells connected to the word lines WLn−1, WLn, and WLn+1 have an erase state E.

For example, when a first program command for writing data '0110' to a word line WLn of a memory block after the erase operation occurs, a pre-program operation for writing the data '0110' to a word line WLn−1 adjacent to the word line WLn is performed before the first program command is performed. A program state of the memory cells connected to the word lines WLn−1, WLn, and WLn+1 of a memory block after the pre-program operation is as shown in FIG. 15B. For reference, in FIG. 15B, 'P' denotes a state of being programmed to data '0', and 'E' denotes an erase state. For example, the erase state denotes data '1'.

After the pre-program operation is performed, a program operation of writing the data '0110' to the word line WLn of the memory block is performed according to the first program command. A program state of the memory cells connected to the word lines WLn−1, WLn, and WLn+1 of a memory block after the program operation is as shown in FIG. 15C.

Referring to FIG. 15C, reliability of the memory cells of the word line WLn is enhanced because data that is the same as the data to be written to the word line WLn is written to the word line WLn−1 through the pre-program operation, and then, the program operation is performed with respect to the word line WLn.

For example, the word line WLn−1 may be a dummy word line, and the word line WLn may be WL1 which is main word line adjacent to the dummy word line.

Figure 16A:
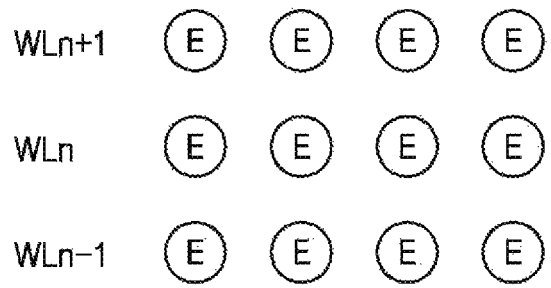
FIGS. 16A to 16C illustrate an example of a pre-program operation process in a case where data to be written to a selection word line according to a first program command in an erased memory block in a memory system according to one or more embodiments is data of a plurality of pages.
Figure 16B:
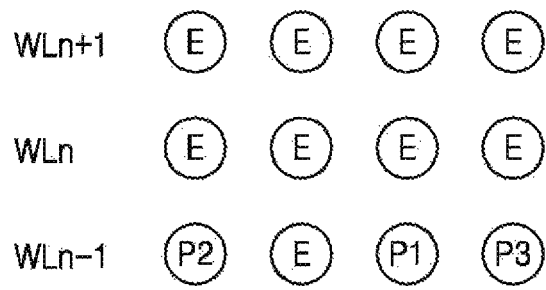
Figure 16C:
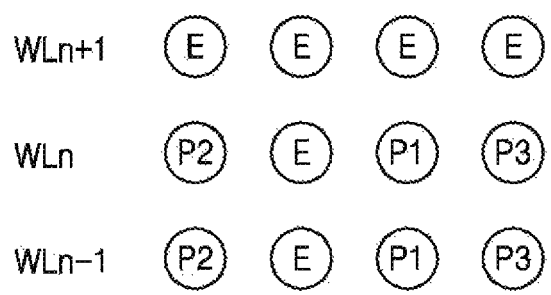

FIGS. 16A to 16C illustrate an example of a pre-program operation process in a case where data to be written to a selection word line according to a first program command in an erased memory block in a memory system according to one or more embodiments is data of a plurality of pages.

FIG. 16A illustrates a program state of memory cells connected to word lines WLn−1, WLn, and WLn+1 of a memory block for which an erase operation has been performed. Since the erase operation has been performed, all the memory cells connected to the word lines WLn−1, WLn, and WLn+1 have an erase state E.

For example, when a first program command for writing data '0101' and '0110' of two pages (e.g., a least significant bit (LSB) page and a most significant bit (MSB) page) to a word line WLn of a memory block after the erase operation occurs, a pre-program operation for writing the data '0101' and '0110' of two pages, which are the same as data to be written to the word line WLn, to a lower word line WLn−1 adjacent to the word line WLn is performed before the first program command is performed. A program state of the memory cells connected to the word lines WLn−1, WLn, and WLn+1 of a memory block after the pre-program operation is as shown in FIG. 16B. For reference, in FIG. 16B, 'E' denotes data '11' in an erase state, 'P1' denotes a state where data '01' has been programmed, 'P2' denotes a state where data '00' has been programmed, and 'P3' denotes a state where data '10' has been programmed.

After the pre-program operation is performed, a program operation for writing the data '0101' and '0110' of two pages to the word line WLn of the memory block is performed according, to the first program command, such that the memory cells of the word line WLn each store two-bit data. A program state of the memory cells connected to the word lines WLn−1, WLn, and WLn+1 of a memory block after the program operation is as shown in FIG. 16C. For example, the word line WLn−1 may be a dummy word line, and the word line WLn may be WL1 which is a main word line adjacent to the dummy word line.

Referring to FIGS. 16A to 16C, in the word line WLn−1, a pre-program operation is performed with respect to two pages, and due to this, the pre-program operation may take a relatively long time to complete. In order to address this, a method of pre-programming, to the word line WLn−1, data of a single page obtained by combining data of a plurality of pages to be written to the selection word line WLn according to the first program command of the erased memory block has been proposed in FIGS. 17A to 17C.

Figure 17A:
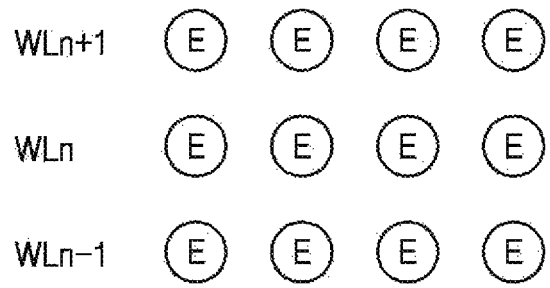
Figure 17B:
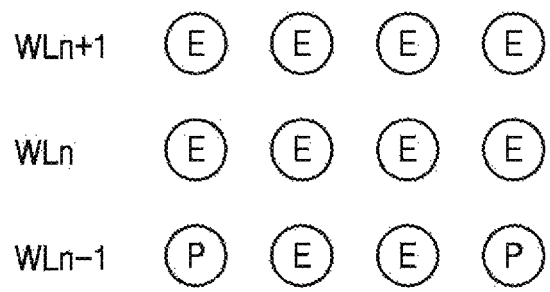
Figure 17C:
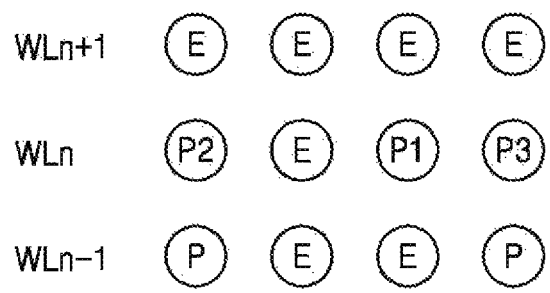

FIGS. 17A to 17C illustrate another example of a pre-program operation process in a case where data to be written to a selection word line according to a first program command in an erased memory block in a memory system according to one or more embodiments is data of a plurality of pages.

FIG. 17A shows a program state of memory cells connected to word lines WLn−1, and WLn+1 of a memory block for which an erase operation has been performed. Since the erase operation has been performed, all the memory cells connected to the word lines WLn−1, WLn, and WLn+1 have an erase state E.

For example, when a first program command for writing data '0101' and '0110' of two pages to a word line WLn of a memory block after the erase operation occurs, data of a single page is generated by combining data of a first page that is to be written to the word line WLn with data of a second page that is to be written to the word line WLn. For example, the data of a single page may be generated by classifying four program states in a multi-level cell into two program states.

For example, the data of a single page may be generated in such a manner that E(11) state and P1(01) state of a multi-level cell are classified into E(1) state of a single-level cell, and P2(00) state and P3(10) state of a multi-level cell are classified into P(0) state of a single-level cell. When the manner is used, data '0110' of a single page may be generated from the upper page data '0101' and the lower page data '0110' which are data of two pages. Alternatively, the data of a single page may be generated by combining data of a plurality of pages in other various methods.

Before the first program command is performed, a pre-program operation for writing the data '0110' of a single page generated as described above to a lower word line WLn−1 adjacent to the word line WLn is performed. A program state of the memory cells connected to the word lines WLn−1, WLn, and WLn+1 of a memory block after the pre-program operation is as shown in FIG. 17B.

After the pre-program operation is performed, a program operation for writing the data '0101' and '0110' of two pages to the word line WLn of the memory block is performed according to the first program command, such that the memory cells of the word line WLn each store two-bit data. A program state of the memory cells connected to the word lines WLn−1, WLn, and WLn+1 of a memory block after the program operation is as shown in FIG. 17C. For reference, in FIG. 17C, 'E' denotes data '11', 'P1' denotes a state where data '01' has been programmed, 'P2' denotes a state where data '00' has been programmed, and 'P3' denotes a state where data '10' has been programmed.

FIGS. 17A to 17C show a case of generating, when data to be written to a selection word line designated by a program command is data of two pages, data to be written to a word line adjacent to the selection word line as one page. According to another embodiment, even when the data to be written to the selection word line is data of three or more pages, the data to be written to the word line adjacent to the selection word line may be generated as one page by using the same method.

Next, an edge word line management operation of a memory device which is performed in various types of memory systems including the memory system 100A or 100B illustrated in FIG. 1 or FIG. 2 will be described with reference to the flowcharts of FIGS. 18 to 21.

Figure 18:
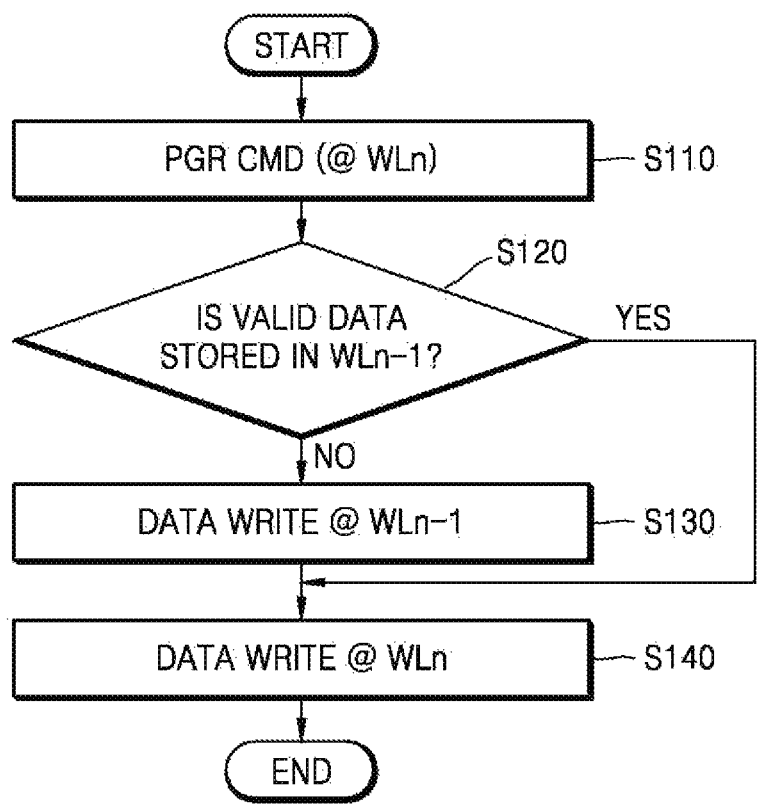
FIG. 18 illustrates an example of a flowchart of a program method of a memory device, according to at least one example embodiment of the inventive concepts.

FIG. 18 illustrates an example of a flowchart of a program method of a memory device, according to at least one example embodiment of the inventive concepts. FIG. 18 will be described below with reference to a memory system examples of which include the memory systems 100A and 100B illustrated in FIGS. 1 and 2.

In operation S110, based on a demand (e.g. a data access request) from a host, a memory system prepares for processing a program command which is to be performed in a selection word line WLn of the memory device. The demand may include data that is to be programmed into the selection word line WLn.

In operation S120, the memory system determines whether valid data is stored in a lower word line WLn−1 adjacent to the selection word line WLn of the memory device where the program command is to be performed.

When it is determined in operation S120 that the valid data is not stored in the lower address WLn−1 adjacent to the selection word line WLn of the memory device where the program command is to be performed, in operation S130, the memory system performs a pre-program operation for writing data to the word line WLn−1. For example, the data selected by the memory system to be written to the word line WLn−1 may be the same as the data to be written to the selection word line WLn designated by the program command. As another example, when the data to be written to the selection word line WLn designated by the program command is data of a plurality of pages, data of a single page obtained by combining the plurality of pages of data to be written to the selection word line WLn may be determined as the data that is to be written to the word line WLn−1. For example, the pre-program operation may be performed using a coarse program method. For example, the pre-program operation may be performed using a one-time program pulse. For example, in the pre-program operation, a program verification operation may be omitted, and thus, not performed.

When it is determined in operation S120 that the valid data is stored in the lower address WLn−1 adjacent to the selection word line WLn of the memory device where the program command is to be performed, or after the pre-program operation according to operation S130 is finished, in operation S140, the memory system performs a program operation for writing data to the selection word line WLn according to the program command.

Figure 19:
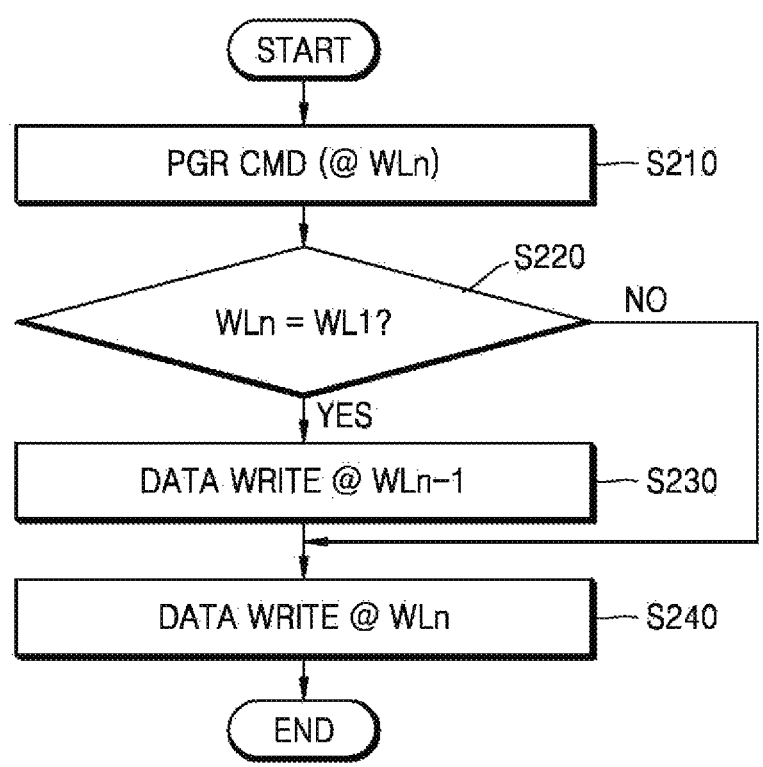
FIG. 19 illustrates another example of a flowchart of a program method of a memory device, according to at least one example embodiment of the inventive concepts.

FIG. 19 illustrates another example of a flowchart of a program method of a memory device, according to at least one example embodiment of the inventive concepts. FIG. 19 will be described below with reference to a memory system examples of which include the memory systems 100A and 100B illustrated in FIGS. 1 and 2.

In operation S210, based on a demand (e.g., a data access request) from a host, a memory system prepares for processing a program command which is to be performed in a selection word line WLn of the memory device. The demand may include data that is to be programmed into the selection word line WLn.

In operation S220, the memory system determines whether the selection word line WLn of the memory device where the program command is to be performed is the same as a word line WL1. In this regard, the word line WL1 refers to a word line which is first programmed according to the program command after a memory block is erased. For example, the word line WL1 may be the MWL, among the plurality of MWLs of the memory system, that is first in a programming order of the MWLs.

When it is determined in operation S220 that the selection word line WLn of the memory device where the program command is to be performed is WL1, in operation S230, the memory system performs a pre-program operation for writing data to the word line WLn−1. For example, the pre-program operation may be performed the same as operation S130 of FIG. 19. After the pre-program operation according to operation S230 is finished, the memory system proceeds to operation S240. In operation S240, the memory system performs a program operation for writing data to the selection word line WLn according to the program command.

When it is determined in operation S220 that the selection word line WLn of the memory device where the program command is to be performed is not WL1, the memory system proceeds to operation S240 without performing operation S230.

Figure 20:
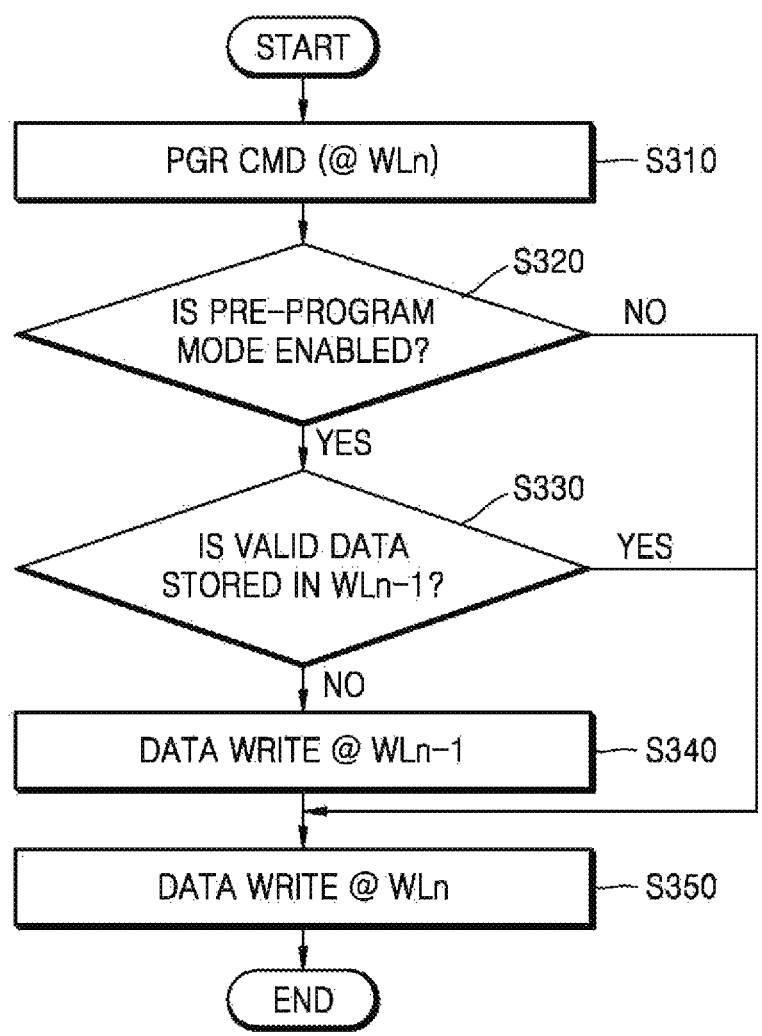
FIG. 20 illustrates another example of a flowchart of a program method of a memory device, according to at least one example embodiment of the inventive concepts.

FIG. 20 illustrates another example of a flowchart of a program method of a memory device, according to at least one example embodiment of the inventive concepts. FIG. 20 will be described below with reference to a memory system examples of which include the memory systems 100A and 100B illustrated in FIGS. 1 and 2.

In operation S310, based on a demand from a host, a memory system prepares for processing a program command which is to be performed in a selection word line WLn of the memory device. The demand may include data that is to be programmed into the selection word line WLn.

In operation S320, the memory system determines whether a pre-program mode is enabled. For example, when a program/erase cycle count for each memory block is greater than an initially set threshold value, a corresponding memory block may be set to a pre-program mode enabled state. As another example, in a test process or user environment, the pre-program mode may be set to be enabled.

When it is determined in operation S320 that the pre-program mode is enabled, in operation S330, the memory system determines whether valid data is stored in a lower word line WLn−1 adjacent to the word line WLn of the memory device where the program command is to be performed.

When it is determined in operation S330 that the valid data is not stored in the lower address WLn−1 adjacent to the word line WLn of the memory device where the program command is to be performed, in operation S340, the memory system performs a pre-program operation for writing data to the word line WLn−1. For example, the pre-program operation may be performed in the same manner as that described above with respect to operation S130 of FIG. 19. After the memory system, performs operation S340, the memory system may proceed to operation S350. In operation S350, the memory system performs a program operation for writing data to the selection word line WLn according to the program command.

When it is determined in operation S320 that the pre-program mode is disabled, or when it is determined in operation S330 that valid data is stored in the lower address WLn−1 adjacent to the word line WLn of the memory device where the program command is to be performed, the memory system proceeds to operation S350, for example, without performing operation S340.

Figure 21:
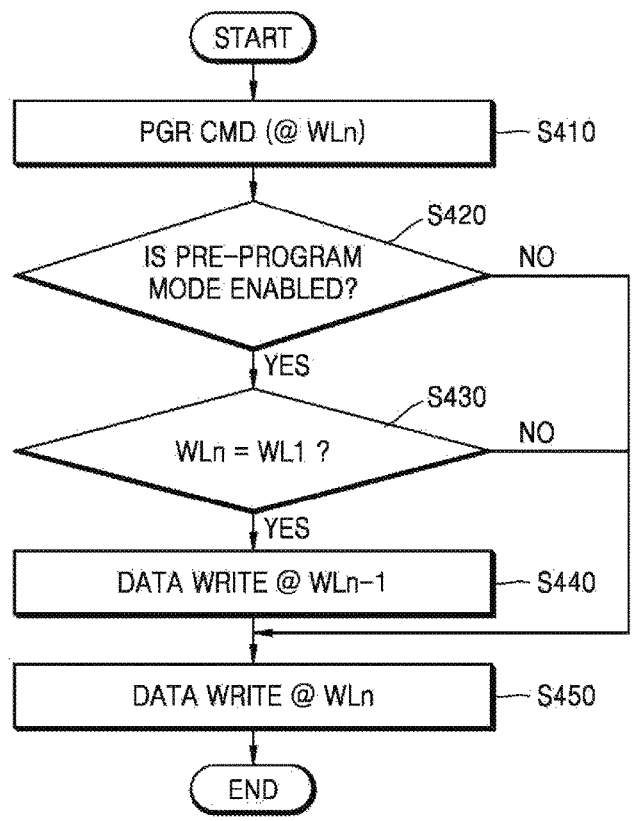
FIG. 21 illustrates another example of a flowchart of a program method of a memory device, according to at least one example embodiment of the inventive concepts.

FIG. 21 illustrates another example of a flowchart of a program method of a memory device, according to at least one example embodiment of the inventive concepts. FIG. 21 will be described below with reference to a memory system examples of which include the memory systems 100A and 100B illustrated in FIGS. 1 and 2.

In operation S410, based on a demand (e.g., a data access request) from a host, a memory system prepares for processing a program command which is to be performed in a selection word line WLn of the memory device. The demand may include data that is to be programmed into the selection word line WLn.

In operation S420, the memory system determines whether a pre-program mode is enabled. For example, when a program/erase cycle count for each memory block is greater than an initially set threshold value, a corresponding memory block may be set to a pre-program mode enabled state. As another example, in a test process or user environment, the pre-program mode may be set to be enabled.

When it is determined in operation S420 that the pre-program mode is enabled, in operation S430, the memory system determines whether the word line WLn of the memory device where the program command is to be performed is the same as a word line WL1. In this regard, the word line WL1 refers to a word line which is first programmed according to the program command after a memory block is erased. For example, the word line WL1 may be the MWL, among the plurality of MWLs of the memory system, that is first in a programming order of the MWLs.

When it is determined in operation S430 that the word line WLn of the memory device where the program command is to be performed is WL1, in operation S440, the memory system performs a pre-program operation for writing data to the word line WLn−1. For example, the pre-program operation may be performed in the same discussed above with reference to operation S130 of FIG. 19. After the memory system performs operation S440, the memory system, proceeds to operation S450. In operation S450, the memory system performs a program operation for writing data to the selection word line WLn according to the program command.

When it is determined in operation S420 that the pre-program mode is disabled, or when it is determined in operation S430 that the word line WLn of the memory device where the program command is to be performed is not WL1, the memory system, proceeds to operation S450, for example, without performing operation S440.

According to at least some example embodiments of the inventive concepts, the operations described above in FIGS. 18-21 may be performed by the pre-program manager 12-1A in the memory system 100A of FIG. 1 and/or the pre-program manager 21 in the memory system 100B of FIG. 2.

Figure 22:
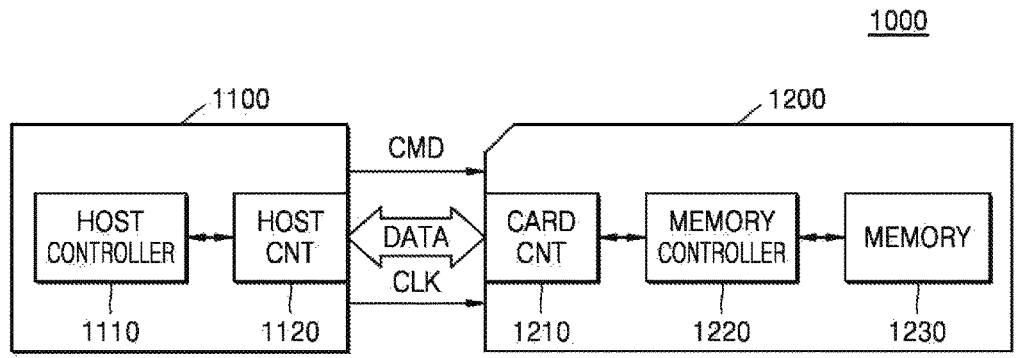
FIG. 22 is a block diagram illustrating an applied example of a memory system according to embodiments to a memory card system.

FIG. 22 is a block diagram illustrating an example of a memory system according to at least some example embodiments of the inventive concepts embodied by a memory card system 1000.

Referring to FIG. 22, the memory card system 1000 may include a host 1100 and a memory card 1200. The host 1100 may include a host controller 1110 and a host connector 1120. The memory card 1200 may include a card connector 1210, a memory controller 1220, and a memory device 1230. According to at least some example embodiments of the inventive concepts, the memory controller 1220 may be an example implementation of the memory controller 20A of FIG. 1 or the memory controller 20B of FIG. 2, and the memory device 1230 may be an example implementation of the memory device 10A of FIG. 1 or the memory device 10B of FIG. 2.

The host 1100 may write data to the memory card 1200 or may read data stored in the memory card 1200. The host controller 1110 may transmit a command CMD, a clock signal CLK generated by a clock generator (not shown) included in the host 1100, and data DATA to the memory card 1200 through the host connector 1120.

The memory controller 1220 may store data in the memory device 1230 in synchronization with a clock signal generated by a clock generator (not shown) included in the memory controller 1220, in response to a command received through the card connector 1210. The memory device 1230 may store data transmitted from the host 1100.

The memory card 1200 may be implemented with a compact flash card (CFC), a Microdrive, a smart media card (SMC), a multimedia card (MMC), a security digital card (SDC), a memory stick, or a USB flash memory driver.

Figure 23:
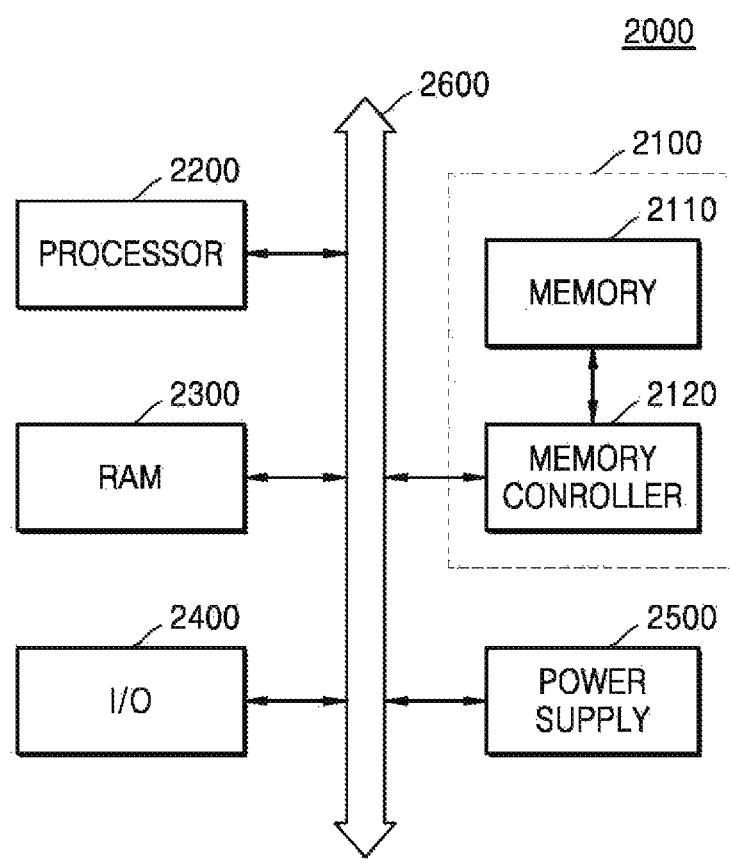
FIG. 23 is a block diagram of a computing system including the memory system according to embodiments.

FIG. 23 is a block diagram of a computing system 2000 including a memory system according to embodiments.

Referring to FIG. 23, the computing system 2000 may include a memory system 2100, a processor 2200, a RAM 2300, an input/output (I/O) device 2400, and a power supply 2500.

The memory system 2100 may include a memory device 2110 and a memory controller 2120. The memory device 2110 may be an example implementation of the memory devices 10A or 10B illustrated in FIGS. 1 and 2, and the memory controller 2120 may be an example implementation of the memory controllers 20A or 20B illustrated in FIGS. 1 and 2. Although not shown in FIG. 23, the computing system 2000 may further include a plurality of ports capable of communicating with a video card, a sound card, a memory card, a USB device, and the like or communicating with other electronic devices. The computing system 2000 may be implemented with a personal computer (PC) or may be implemented with a portable electronic device such as a laptop computer, a cellular phone, a personal digital assistant (PDA), or a camera.

The processor 2200 may perform certain calculations or tasks. According to embodiments, the processor 2200 may be a microprocessor or a CPU. The processor 2200 may communicate with the RAM 2300, the I/O device 2400, and the memory system 2100 through the bus 2600 such as an address bus, a control bus, or a data bus. According to embodiments, the processor 2200 may be connected to an extension bus such as a peripheral component interconnect (PCI) bus.

The RAM 2300 may store data necessary for an operation of the computing system 2000. For example, the RAM 2300 may be implemented with dynamic RAM (DRAM), mobile DRAM, static random access memory (SRAM), phase-change random access memory (PRAM), ferroelectric random access memory (FRAM), resistive random access memory (RRAM), and magnetoresistive random access memory (MRAM).

The I/O device 2400 may include an input unit, such as a keyboard, a keypad, or a mouse, and an output unit such as a display. The power supply 2500 may supply an operation voltage necessary for an operation of the computing system 2000.

Figure 24:
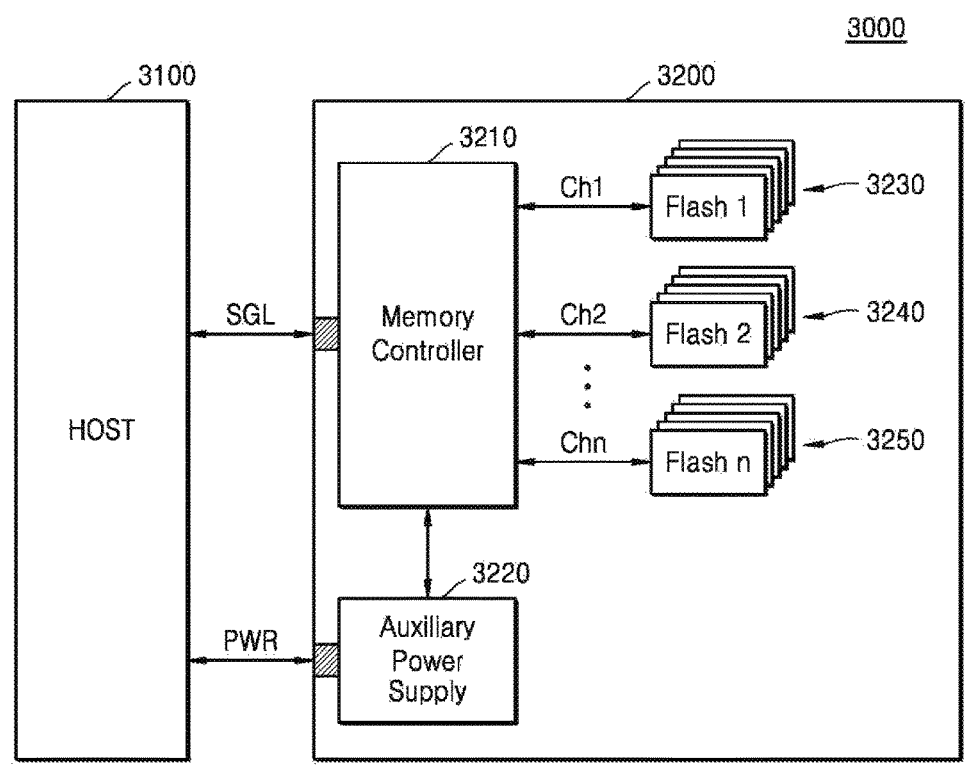
FIG. 24 is a block diagram illustrating an applied example of the memory system according to embodiments to an SSD system.

FIG. 24 is a block diagram illustrating an applied example of a memory system according to embodiments to a solid state disk (SSD) system 3000.

Referring to FIG. 24, the SSD system 3000 may include a host 3100 and an SSD 3200. The SSD 3200 may transmit or receive a signal to or from the host 3100 through a signal connector and may receive power through a power connector. The SSD 3200 may include a memory controller 3210, an auxiliary power supply 3220, and a plurality of memory devices 3230, 3240 and 3250. The memory controller 20A or 20B and the memory device 10A or 10B illustrated in FIG. 1 or FIG. The memory controller 3210 may be an example implementation of the memory controller 20A of FIG. 1 or the memory controller 20B of FIG. 2, and each of the memory devices 3230, 3240 and 3250 may be an example implementation of the memory device 10A of FIG. 1 or the memory device 10B of FIG. 2.

At least one example embodiment of the inventive concepts may be implemented as a method, a device, a system, or the like. When at least one example embodiment of the inventive concepts is implemented as software, elements according to at least one example embodiment of the inventive concepts may be code segments for performing necessary operations. A program or code segments may be stored in a processor-readable (i.e., computer-readable) medium. The processor-readable medium may include any medium for storing information. Examples of the processor-readable medium may include an electronic circuit, a semiconductor memory device, ROM, flash memory, erasable ROM (EROM), floppy disk, optical disk, hard disk, etc.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A program method of a memory device, the method comprising:
   determining whether valid data is stored in memory cells of a word line adjacent to a selection word line upon which a program operation is to be performed;
   when the valid data is not stored in the memory cells of the word line adjacent to the selection word line, performing, based on data to be written to the selection word line, a pre-program operation on the word line adjacent to the selection word line; and
   after the performing of the pre-program operation, performing, based on a program command, the program operation on the selection word line.

2. The method of claim 1, wherein, when the program command is a program command for performing a first program operation on an erased memory block of a memory device, the valid data is determined as being not stored in the memory cells of the word line adjacent to the selection word line.

3. The method of claim 1, wherein,
   at least one dummy memory cell is located between a main memory cell and a ground selection transistor of a cell string included in a memory block of the memory device, and the main memory cell is adjacent to the at least one dummy memory cell, and
   when the selection word line upon which the program operation is to be performed is a word line to which the main memory cell adjacent to the at least one dummy memory cell is connected, the valid data is determined as being not stored in the memory cells of the word line adjacent to the selection word line.

4. The method of claim 3, wherein the performing the pre-program operation performs the pre-program operation on a word line to which the at least one dummy memory cell adjacent to the main memory cell of the cell string is connected.

5. The method of claim 3, wherein, the pre-program operation is performed on a word line to which the at least one dummy memory cell adjacent to the main memory cell of the cell string is connected, and then, the program operation according to the program command is performed on the selection word line to which the main memory cell is connected.

6. The method of claim 1, wherein the pre-program operation comprises:
   writing, to the word line adjacent to the selection word line, data which is the same as data to be written to the selection word line.

7. The method of claim 1, wherein the pre-program operation comprises:
   setting an increase range of a program voltage level according to a program loop change to be large compared to an increase range of a program voltage level according to a program loop change of the program operation to be performed on the selection word line.

8. The method of claim 1, wherein the pre-program operation is performed using a one-time program pulse.

9. The method of claim 8, wherein the pre-program operation includes no verification operation.

10. The method of claim 1, wherein the pre-program operation comprises:
    when data to be programmed into the selection word line is data of at least two pages,
    determining data by combining the data of the at least two pages, and
    writing the determined data to the word line adjacent to the selection word line.

11. The method of claim 10, wherein the pre-program operation comprises:
    determining single-page data by combining the data of at least two pages to be written to the selection word line; and
    writing the single-page data to the word line adjacent to the selection word line.

12. A memory system comprising:
    a non-volatile memory device comprising a memory cell array which is connected to a plurality of word lines and a plurality of bit lines; and
    a memory controller configured to control, based on a program command which is received from a host, an operation of the non-volatile memory device,
    the non-volatile memory device and the memory controller being configured such that, when valid data is not stored in memory cells of a word line which is adjacent to a selection word line of the non-volatile memory device upon which a program operation is to be performed, at least one of the non-volatile device and the memory controller,
    performs a pre-program operation, based on data to be written to the selection word line, on the word line adjacent to the selection word line, and then,
    performs the program operation according to the program command.

13. The system of claim 12, wherein, the non-volatile device and the memory controller being configured such that, when the program command is a program command for performing a first program operation on an erased memory block of the non-volatile memory device, at least one of the non-volatile device and the memory controller performs the pre-program operation on a dummy word line adjacent to the selection word line.

14. The system of claim 13, wherein data, which is written to the dummy word line, is the same as one to be written to the selection word line.

15. The system of claim 13, wherein, when data to be programmed into the selection word line is data of at least two pages, data, which is written to the dummy word line adjacent to the selection word line according to the pre-program operation, is determined as single-page data obtained by combining the data of at least two pages to be written to the selection word line.

16. A method comprising:
    performing a programming operation including programming write data into memory cells of a first word line from among a plurality of word lines included in a memory cell array of a memory device; and preforming a preliminary operation before performing the programming operation, the preliminary operation including,
  determining preliminary data based on the write data, and
  programming the preliminary data into memory cells of an adjacent word line, the adjacent word line being a word line, from among the plurality of word lines, that is adjacent to the first word line.

17. The method of claim 16, wherein the write data is data included in a data access request issued by a host before performing the programming operation.

18. The method of claim 16, wherein the determining preliminary data based on the write data determines the preliminary data such that the preliminary data is the same as the write data.

19. The method of claim 16, further comprising:
determining whether valid data is stored in the adjacent word line; and wherein the programming of the preliminary data is performed when valid data is determined not to be stored in the adjacent word line; and the programming of the preliminary data is not performed when valid data is determined to be stored in the adjacent word line.

20. The method of claim 19, further comprising:
determining whether a pre-program mode of the memory device is enabled; and wherein the programming of the preliminary data is performed when valid data is determined not to be stored in the adjacent word line and the pre-program mode of the memory device is determined to be enabled, the programming of the preliminary data is not performed when valid data is determined to be stored in the adjacent word line or the pre-program mode of the memory device is determined not to be enabled.

* * * * *